US010062670B2

(12) United States Patent
Frenette et al.

(10) Patent No.: US 10,062,670 B2
(45) Date of Patent: *Aug. 28, 2018

(54) RADIO FREQUENCY SYSTEM-IN-PACKAGE WITH STACKED CLOCKING CRYSTAL

(71) Applicant: Skyworks Solutions, Inc., Woburn, MA (US)

(72) Inventors: Darren Roger Frenette, Pakenham (CA); George Khoury, Ottawa (CA); Leslie Paul Wallis, Ottawa (CA)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/489,528

(22) Filed: Apr. 17, 2017

(65) Prior Publication Data

US 2017/0301653 A1 Oct. 19, 2017

Related U.S. Application Data

(60) Provisional application No. 62/323,912, filed on Apr. 18, 2016.

(51) Int. Cl.
*H01L 25/065* (2006.01)
*H01L 23/498* (2006.01)
(Continued)

(52) U.S. Cl.
CPC .... *H01L 25/0657* (2013.01); *H01L 23/49816* (2013.01); *H01L 23/66* (2013.01); *H01L 2223/6677* (2013.01); *H01L 2224/16145* (2013.01); *H01L 2224/48091* (2013.01); *H01L 2224/48137* (2013.01);
(Continued)

(58) Field of Classification Search
CPC ........... H01L 25/0657; H01L 23/49816; H01L 23/66; H01L 2273/6677; H01L 2225/06513; H01L 2225/0651; H01L 2225/6677; H01L 2924/00014;
(Continued)

(56) References Cited

U.S. PATENT DOCUMENTS 8,310,835 B2 11/2012 Lin et al.
8,456,856 B2 * 6/2013 Lin ....................... H01L 21/563
257/686

(Continued)

OTHER PUBLICATIONS

Campbell, E., Bluetooth Radio Design Considerations for Cellular Handset Application, RF Globalnet, Apr. 3, 2001, 13 pages.

(Continued)

*Primary Examiner* — Alexander Oscar Williams
(74) *Attorney, Agent, or Firm* — Knobbe, Martens, Olson & Bear, LLP

(57) ABSTRACT

A packaged module for use in a wireless communication device has a substrate supporting a crystal and a first die that includes at least a microprocessor and one or more of radio frequency transmitter circuitry and radio frequency receiver circuitry. The first die is disposed between the crystal and the substrate. An overmold encloses the first die and the crystal. The substrate also supports a second die that includes at least a power amplifier for amplifying a radio frequency input signal, where the second die is disposed on an opposite side of the substrate from the first die and the crystal.

20 Claims, 12 Drawing Sheets

(51) Int. Cl.
*H01L 23/66* (2006.01)
*H03F 3/195* (2006.01)
*H03F 3/213* (2006.01)

(52) U.S. Cl.
CPC ............. *H01L 2224/48145* (2013.01); *H01L 2225/0651* (2013.01); *H01L 2225/06513* (2013.01); *H01L 2924/19104* (2013.01); *H01L 2924/19105* (2013.01); *H03F 3/195* (2013.01); *H03F 3/213* (2013.01); *H03F 2200/294* (2013.01); *H03F 2200/451* (2013.01)

(58) Field of Classification Search
CPC .... H03F 2200/451; H03F 3/195; H03F 3/213; H03F 2200/294
USPC ....... 257/738, 778, 723, 686, 685, 777, 724, 257/728
See application file for complete search history.

(56) References Cited

U.S. PATENT DOCUMENTS

| | | | |
|---|---|---|---|
| 9,660,609 B2 | 5/2017 | Reisner et al. | |
| 9,691,710 B1 | 6/2017 | Deng et al. | |
| 9,871,007 B2* | 1/2018 | Meyers | H01L 25/50 |
| 2005/0045729 A1* | 3/2005 | Yamazaki | G06K 19/0704 235/492 |
| 2006/0245308 A1 | 11/2006 | Macroupoulos et al. | |
| 2008/0061419 A1 | 3/2008 | Enquist et al. | |
| 2009/0267220 A1 | 10/2009 | Kuhlman et al. | |
| 2010/0202126 A1 | 8/2010 | Nakamura et al. | |
| 2011/0042798 A1 | 2/2011 | Pagaila et al. | |
| 2011/0175789 A1 | 7/2011 | Lee et al. | |
| 2013/0100616 A1 | 4/2013 | Zohni et al. | |
| 2013/0343022 A1* | 12/2013 | Hu | H01L 25/16 361/761 |
| 2014/0124956 A1 | 5/2014 | Lee | |
| 2014/0232477 A1 | 8/2014 | Park et al. | |
| 2017/0232345 A1* | 8/2017 | Rofougaran | A63F 13/573 463/2 |
| 2017/0237181 A1* | 8/2017 | Chen | H01Q 21/22 343/702 |
| 2017/0278816 A1* | 9/2017 | Li | H01L 24/14 |
| 2017/0301654 A1 | 10/2017 | Frenette et al. | |
| 2017/0301655 A1 | 10/2017 | Frenette et al. | |
| 2017/0302224 A1 | 10/2017 | Frenette et al. | |
| 2017/0302325 A1* | 10/2017 | Frenette | H04B 1/40 |
| 2017/0303400 A1 | 10/2017 | Frenette et al. | |

OTHER PUBLICATIONS

Chip Design, Tools, Technologies & Methodologies, "Coordinating from Silicon to Package", Mar. 17, 2008, 11 pages.

Kim, et al., "Bounded skew clock routing for 3D stacked IC designs: Enabling trade-offs between power and clock skew," International Conference on Green Computing, Chicago, IL, Aug. 2010, 2 pages.

Qualcomm, 3D VLSI: Next Generation #D Integration Technology, 2015, 60 pages.

Stoukatch, et al.: "3D-SIP integration for autonomous sensor nodes," 56th Electronic Components and Technology Conference 2006, San Diego, CA, 2006, 2 pages.

SESUB modules for smartphones: Very small and extremely flat, TDK Europe, EPCOS, Nov. 2012, 3 pages.

Weerasekera, et al.: "Extending systems-on-chip to the third dimension: Performance, cost and technological tradeoffs," IEEE/ACM International Conference on Computer-Aided Design, Digest of Technical Papers, ICCAD. 212-219. 10.1109/ICCAD.2007. 4397268, Dec. 2007, 9 pages.

EM358x High-Performance, Integrated ZigBee/802.15.4 System-on-Chip Family, Apr. 2014, by Silicon Laboratories, located at https://www.silabs.com/documents/public/data-sheets/EM358x. pdf.

* cited by examiner

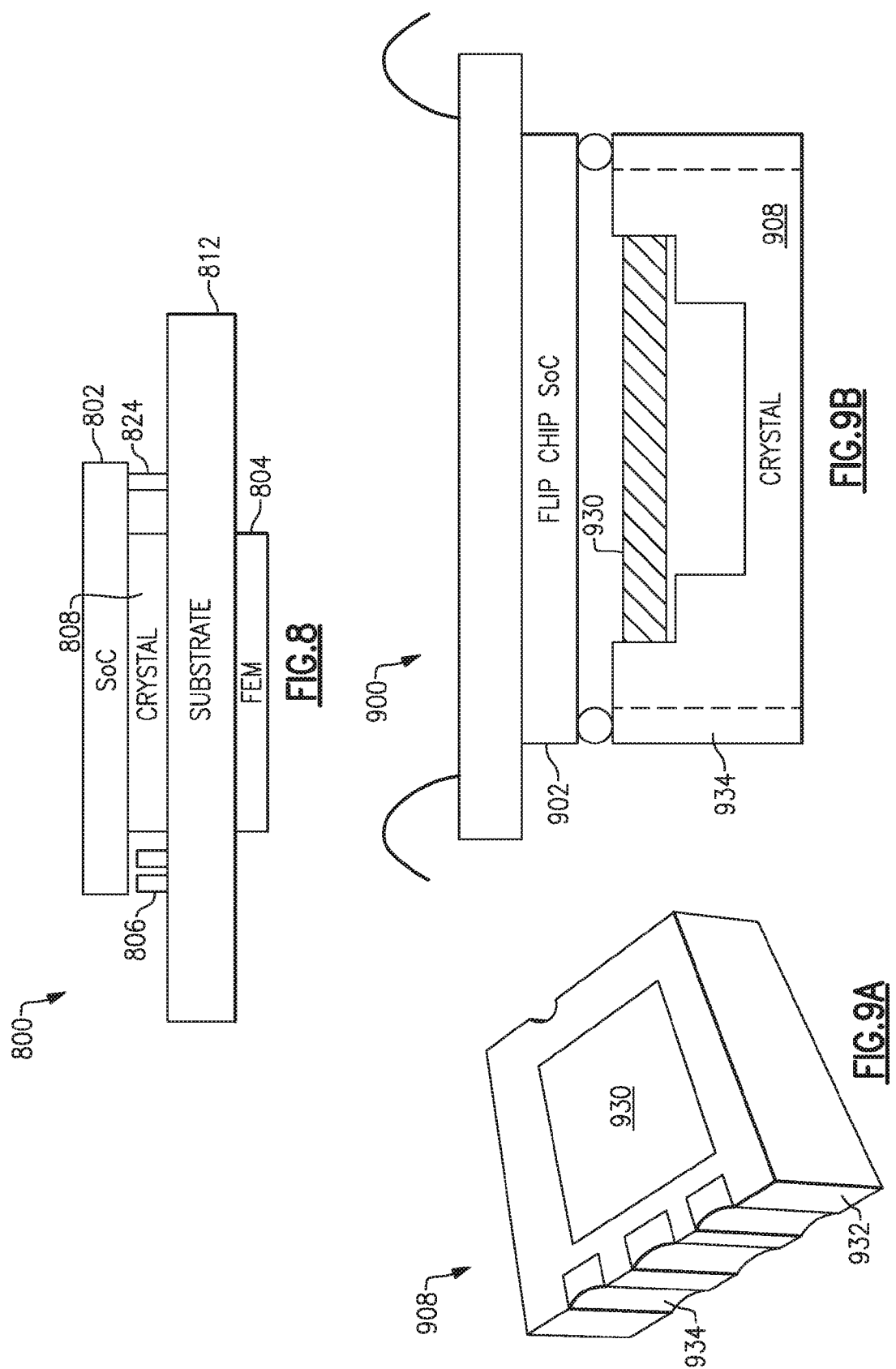

US 10,062,670 B2

RADIO FREQUENCY SYSTEM-IN-PACKAGE WITH STACKED CLOCKING CRYSTAL

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57. The application is related to U.S. Publication No. 2017/0302325 A1, filed on Apr. 17, 2017, and titled "RADIO FREQUENCY SYSTEM-IN-PACKAGE INCLUDING A STACKED SYSTEM-ON-CHIP"; U.S. Publication No. 2017/0301654 A1, filed on Apr. 17, 2017, and titled "SYSTEM IN PACKAGE WITH VERTICALLY ARRANGED RADIO FREQUENCY COMPONENTRY"; U.S. Publication No. 2017/0301655 A1, filed on Apr. 17, 2017, and titled "REDUCED FORM FACTOR RADIO FREQUENCY SYSTEM-IN-PACKAGE"; U.S. Publication No. 2017/0302224 A1, filed on Apr. 17, 2017, and titled "CRYSTAL PACKAGING WITH CONDUCTIVE PILLARS"; and U.S. Publication No. 2017/0303400 A1, filed on Apr. 17, 2017, and titled "SURFACE MOUNT DEVICE STACKING FOR REDUCED FORM FACTOR".

BACKGROUND

Multi-chip modules (MCM) interconnect many smaller integrated circuits (IC) in a horizontal form factor. In wireless devices, MCMs provide radio frequency (RF) functionality and comprise a system-on-a-chip (SoC), a crystal for clocking purposes, and a front-end module (FEM). The SoC integrates multiple functions in a single IC and tend to be the largest of these components. The crystal tends to be large as well. In a traditional MCM-based design, the SoC, crystal, crystal trace routing, and crystal load capacitors occupy the majority of the area of the MCM and create a large MCM footprint, which makes designing constantly smaller wireless devices with greater functionality difficult. Also, long crystal routing paths add parasitic capacitance, which can adversely affect the ability for the crystal to start oscillating at power up.

SUMMARY

A system-in-a package (SiP) brings together ICs including SoCs and discrete components using vertical integration technologies of at least some of the components. A feature of the SiP is small package size in length (x dimension) and width (y dimension). This disclosure offers a number of options to stack the SoC, crystal, surface mount components (SMTs), and the front-end integrated circuit (FEIC) on a substrate. As the crystal is generally smaller than the SoC, the footprint of the crystal and crystal routing are effectively removed from the x and y dimensions of the SiP. In addition to reduced package size, other advantages are decreased crystal trace parasitic capacitance and reduced coupling between the crystal routing traces and other sensitive paths on the substrate. Any of the SiPs, MCMs, and other packaged devices or other components described herein, including those having vertically integrated/stacked configurations can be configured to implement wireless RF transceiver functionality. For instance, such devices can be configured to support one or more wireless local area network (WLAN) standards such as Wi-Fi or Bluetooth (e.g., compliant with one or more of the IEEE 802.11 family of standards), and/or one or more cellular technologies, such as Long Term Evolution (LTE), Global System for Mobile Communications (GSM), Wideband Code Division Multiple Access (WCDMA), and/or Enhanced Data Rates for GSM Evolution (EDGE).

The role of a substrate is to provide the interconnections to form at least a portion of an electric circuit. In an embodiment, a printed circuit board (PCB) or some other board mechanically supports and electrically connects electrical components using conductive tracks, pads and other features laminated onto a substrate. In an embodiment, a system-in-package (SiP) comprises a number of integrated circuits (ICs) mounted on a substrate and enclosed in a single module (package). The integrated circuits in the SiP can be internally connected by fine wires that are bonded to the package. In an embodiment, a system-on-chip (SoC) comprises an integrated circuit (IC) that integrates one or more components of an electronic system into a single substrate. In an embodiment, a multi-chip module (MCM) comprises an electronic assembly that includes multiple integrated circuits (ICs), semiconductor dies and/or other discrete components integrated onto a unifying substrate.

Certain embodiments relate to a packaged module for use in a wireless communication device, where the packaged module comprises a substrate; a first die supported by the substrate and including at least a microprocessor and one or more of radio frequency transmitter circuitry and radio frequency receiver circuitry; and a crystal supported by the substrate. The first die is disposed between the crystal and the substrate. In some embodiments, the packaged module further comprises an overmold which encloses the first die and the crystal.

In some embodiments, the packaged module further comprises a second die supported by the substrate and including at least a power amplifier for amplifying a radio frequency input signal, the second die disposed on an opposite side of the substrate from the first die and the crystal. In some embodiments, the crystal is packaged in a housing having one or more pillars along one or more sides of the housing, the one or more pillars formed from a top surface of the housing to a bottom surface of the housing and including a conductive material. In some embodiments, the packaged module further comprises an interposer disposed between the crystal and the first die.

In some embodiments, the crystal is physically mounted to the interposer and is in electrical communication with the interposer, where the interposer is configured to route signals between the crystal and the substrate via wire bonds from the interposer to the substrate. In some embodiments, the packaged module further comprises one or more load capacitors associated with the crystal, where the one or more load capacitors are physically mounted to the interposer and in electrical communication with the interposer, and the interposer is configured to route signals between the one or more load capacitors and the crystal. In some embodiments, the first die is wire bonded to the substrate.

In some embodiments, the first die is housed in a flip chip package and in electrical communication with the substrate via solder bumps associated with the flip chip package. In some embodiments, the crystal is attached to the first die. In some embodiments, the crystal is packaged in a flip chip package and in electrical communication with the first die via solder bumps associated with the flip chip package. In some embodiments, the crystal is packaged in a surface mount package that is mounted upside down on the first die.

In some embodiments, a first surface mount pad of the surface mount package is in electrical communication with a crystal oscillator circuit via a first wirebond and a second surface mount pad of the surface mount package is in electrical communication with a ground via a second wirebond. In some embodiments, at least one load capacitor associated with the crystal is mounted across first and second wirebond pads of the surface mount package and in electrical communication with the substrate via at least one wirebond. In some embodiments, a first end of a load capacitor associated with the crystal is in electrical communication with a first wirebond pad of the surface mount package and a second end of the load capacitor is wirebonded to a second surface mount pad of the surface mount package. In some embodiments, an equivalent series resistance of the crystal is approximately 150 ohms.

According to a number of other embodiments, the disclosure relates to a stacked circuit assembly for use in a packaged module, where the stacked circuit assembly comprises a substrate; a first die supported by the substrate and including at least a microprocessor and one or more of radio frequency transmitter circuitry and radio frequency receiver circuitry; and a crystal supported by the substrate, the first die disposed between the crystal and the substrate.

Certain other embodiments relate to a wireless device comprising an antenna implemented to receive a radio frequency input signal and to transmit a radio frequency output signal; and a packaged module. The packaged module includes a substrate, a first die supported by the substrate and including at least a microprocessor and one or more of radio frequency transmitter circuitry and radio frequency receiver circuitry, a crystal supported by the substrate, and an overmold which encloses the first die and the crystal, where the first die is disposed between the crystal and the substrate, and the packaged module is implemented to provide the antenna with the radio frequency output signal and to receive from the antenna the radio frequency input signal. In some embodiments the wireless device further comprises a front-end integrated circuit supported by the substrate over one side of the substrate, where the first die and the crystal are supported over an opposite side of the substrate. In some embodiments, an equivalent series resistance of the crystal is approximately 100 ohms.

Certain embodiments relate to a packaged module for use in a wireless communication device, where the packaged module comprises a substrate; a crystal supported by the substrate; and a first die supported by the substrate and including at least a microprocessor and one or more of radio frequency transmitter circuitry and radio frequency receiver circuitry. The crystal is disposed between the first die and the substrate. In some embodiments, the packaged module further comprises an overmold which encloses the crystal and the first die.

In some embodiments, the packaged module further comprises a second die supported by the substrate and including at least a power amplifier for amplifying a radio frequency input signal, the second die disposed on an opposite side of the substrate from the first die and the crystal. In some embodiments, the crystal is mounted to the first die and to the substrate. In some embodiments, the first die includes an overhanging portion extending beyond at least one edge of the crystal.

In some embodiments, the packaged module further comprises one or more load capacitors associated with the crystal, where at least some of the one or more load capacitors is disposed under the overhanging portion and mounted to the substrate. In some embodiments, the one or more load capacitors provide mechanical support for the overhanging portion of the first die. In some embodiments, the packaged module further comprises a radio frequency front-end integrated circuit at least partially disposed under the overhanging portion and mounted to the substrate.

In some embodiments, the packaged module further comprises a radio frequency front-end integrated circuit supported by the substrate, the first die being disposed between the front-end integrated circuit and the crystal. In some embodiments, the packaged module further comprises a ground plane disposed between the front-end integrated circuit and the first die. In some embodiments, the packaged module further comprises one or more supports disposed under the overhanging portion and between the first die and the substrate, the one or more supports configured to provide mechanical support for the first die.

In some embodiments, the one or more supports are conductive and provide a ground connection between the first die and the substrate. In some embodiments, the packaged module further comprises one or more spacers disposed between one of the one or more supports and the first die, the one or more spacers configured to compensate for height differences between the one or more supports. In some embodiments, the one or more spacers include a compressible material to fill a gap between at least one of the one or more spacers and the first die.

In some embodiments, the one or more spacers include a conductive material. In some embodiments, an equivalent series resistance of the crystal is approximately 150 ohms.

According to a number of other embodiments, the disclosure relates to a stacked circuit assembly for use in a packaged module, where the stacked circuit assembly comprises a substrate; a crystal supported by the substrate; and a first die supported by the substrate and including at least a microprocessor and one or more of radio frequency transmitter circuitry and radio frequency receiver circuitry. The crystal is disposed between the first die and the substrate. In some embodiments, the packaged module further comprises a radio frequency front-end integrated circuit in electrical communication with the substrate and including at least a power amplifier for amplifying a radio frequency input signal, where the first die, the crystal, and the front-end integrated circuit are enclosed within a common package.

In some embodiments, the first die includes an overhanging portion extending beyond at last one edge of the crystal. In some embodiments, the stacked assembly further comprises one or more load capacitors associated with the crystal, where at least some of the one or more load capacitors disposed under the overhanging portion and mounted to the substrate.

Certain other embodiments relate to a wireless device comprising an antenna implemented to receive a radio frequency input signal and to transmit a radio frequency output signal; and a packaged module including a substrate, a crystal supported by the substrate, and a first die supported by the substrate and including at least a microprocessor and one or more of radio frequency transmitter circuitry and radio frequency receiver circuitry, and an overmold which encloses the crystal and the first die, the crystal disposed between the first die and the substrate.

Certain embodiments relate to a packaged module for use in a wireless communication device, where the packaged module comprises a substrate; a first integrated circuit die supported by the substrate and implementing at least a portion of a radio frequency baseband subsystem; and a second integrated circuit die supported by the substrate and implementing at least a portion of a radio frequency front end including a radio frequency power amplifier. The substrate is disposed between the first integrated circuit die and the second integrated circuit die. In some embodiments, the packaged module further comprises an overmold enclosing one of the first integrated circuit die and the second integrated circuit die.

In some embodiments, the packaged module further comprises a crystal supported by the substrate and disposed over the same side of the substrate as the first integrated circuit die. In some embodiments, the first integrated circuit die forms a part of a system on chip implementing the baseband subsystem on a single integrated circuit die. In some embodiments, the crystal is included in a package including at least one load capacitor, the crystal and the at least one load capacitor forming at least a portion of a crystal oscillator circuit.

In some embodiments, one or both of the first integrated circuit die and the second integrated circuit die are configured to receive a clock signal generated by the crystal oscillator circuit. In some embodiments, the first integrated circuit die is between the crystal and the substrate. In some embodiments, the first integrated circuit die is over the crystal such that the crystal is between the first integrated circuit die and the substrate.

In some embodiments, at least a portion of the first integrated circuit die includes an overhanging portion extending beyond at least one edge of the crystal. In some embodiments, the packaged module further comprises one or more components disposed under the overhanging portion and mounted to the substrate. In some embodiments, the packaged module further comprises one or more supports disposed under the overhanging portion and configured to provide mechanical support for the first integrated circuit die.

In some embodiments, the one or more supports are conductive and provide a ground connection between the first integrated circuit die and the substrate. In some embodiments, the packaged module further comprises one or more spacers disposed between one of the one or more supports and the second integrated circuit die, the one or more spacers configured to compensate for height differences between the one or more supports. In some embodiments, an equivalent series resistance of the first integrated circuit die is approximately 150 ohms.

According to a number of other embodiments, the disclosure relates to stacked circuit assembly comprising a substrate; a first integrated circuit die supported by the substrate and implementing at least a portion of a radio frequency baseband subsystem; and a second integrated circuit die supported by the substrate and implementing at least a portion of a radio frequency front end including a radio frequency power amplifier, where the substrate is disposed between the first integrated circuit die and the second integrated circuit die.

In some embodiments, the packaged module further comprises a crystal supported by the substrate and disposed over a same side of the substrate as the first integrated circuit die. In some embodiments, the crystal is included in a package including at least one load capacitor, the crystal and the at least one load capacitor forming at least a portion of a crystal oscillator circuit. In some embodiments, the first integrated circuit die forms a part of a system on chip implementing the baseband subsystem on a single integrated circuit die.

In some embodiments, one or both of the first integrated circuit die and the second integrated circuit die are configured to receive a clock signal generated by the crystal oscillator circuit. In some embodiments, the first integrated circuit die is between the crystal and the substrate.

Certain other embodiments relate to a wireless device comprising an antenna implemented to receive a radio frequency input signal and to transmit a radio frequency output signal; and a packaged module including a substrate, a first integrated circuit die supported by the substrate and implementing at least a portion of a radio frequency baseband subsystem, a second integrated circuit die supported by the substrate and implementing at least a portion of a radio frequency front end including a radio frequency power amplifier, and an overmold enclosing one of the first integrated circuit die and the second integrated circuit die, the substrate disposed between the first integrated circuit die and the second integrated circuit die. The packaged module is implemented to provide the antenna with the radio frequency output signal and to receive from the antenna the radio frequency input signal.

Certain embodiments relate to a packaged module for a radio frequency wireless device comprising a substrate; a first wireless device component supported by the substrate; and a second wireless device component supported by and spaced from the substrate, where the first wireless device component is between the second wireless device component and a first surface of the substrate. At least a first overhanging portion of the second wireless device component extends beyond at least a portion of the periphery of the first wireless device component. In some embodiments, an overmold encloses the first wireless device component and the second wireless device component.

In some embodiments, the packaged module further comprises a third wireless device component supported by the substrate, the substrate being between the first wireless device component and the third wireless device component. In some embodiments, the third wireless device component is mounted to a second surface of the substrate opposite the first surface. In some embodiments, the third wireless device component mounts to the first surface of the substrate, underneath the first overhanging portion.

In some embodiments, the first wireless device component includes a crystal for use in a crystal oscillator circuit, and the second wireless device component includes a first integrated circuit die implementing at least a portion of a radio frequency baseband subsystem.

In some embodiments, the packaged module further comprises first, second, and third surface mount passive components configured in a pi filter topology and mounted to the first surface of the substrate, underneath the first overhanging portion. In some embodiments, the packaged module further comprises first, second, third, and fourth surface mount passive components configured in a band-reject filter topology and mounted to the first surface of the substrate, underneath the first overhanging portion. In some embodiments, the packaged module further comprises one or more supports disposed underneath the first overhanging portion and configured to provide mechanical support for the second die.

In some embodiments, the one or more supports are conductive and are configured to conduct a signal from the second wireless device component to the substrate. In some embodiments, the packaged module further comprises one or more spacers disposed between the one or more supports and the underside of the first overhanging portion. In some embodiments, the one or more spacers include compressible material and are configured to compressibly fill a gap between the one of more supports and the underside of the first overhanging portion.

In some embodiments, the one or more spacers include conductive material. In some embodiments, the packaged module further comprises one or more passive components in electrical communication with the substrate and underneath the first overhanging portion.

According to a number of other embodiments, the disclosure relates to a stacked circuit assembly for use in a packaged radio frequency module, where the stacked circuit assembly comprises a substrate; a first wireless device component supported by the substrate; and a second wireless device component supported by and spaced from the substrate. The first wireless device component is between the second wireless device component and a first surface of the substrate, and at least a first overhanging portion of the second wireless device component extends beyond at least a portion of the periphery of the first wireless device component.

In some embodiments, the stacked circuit assembly further comprises one or more supports disposed between an underside of the first overhanging portion and the substrate, where the one or more supports are configured to provide mechanical support for the first overhanging portion. In some embodiments, the stacked circuit assembly further comprises at least one spacer disposed between a corresponding support of the one or more supports and the first overhanging portion or between said corresponding support and the first surface of the substrate.

Certain other embodiments relate to a method to form a stacked circuit assembly, where the method comprises mounting a first wireless device component to a first surface of a substrate; and placing a second wireless device component over the first wireless device component such that the first wireless device component is disposed between the second wireless device component and the first surface of the substrate. A first overhanging portion of the second wireless device component extends beyond a periphery of the first wireless device component. The method further comprises electrically connecting the first wireless device component with the second wireless device component; electrically connecting the second wireless device component with the substrate; and enclosing the first and second wireless device components within a single package.

In some embodiments, the method further comprises mechanically supporting the second die with one or more supports disposed between an underside of the first overhanging portion and the substrate. In some embodiments, the method further comprises compensating for a height difference between the one or more supports by placing at least one spacer between a corresponding support of the one or more supports and the first overhanging portion or between the corresponding support and the first surface of the substrate. In some embodiments, the at least one spacer includes a compressible material.

Certain aspects, advantages, and novel features of the inventions can be described herein. It can be to be understood that not necessarily all such advantages may be achieved in accordance with any particular embodiment of the inventions disclosed herein. Thus, the inventions disclosed herein may be embodied or carried out in a manner that achieves or selects one advantage or group of advantages as taught herein without necessarily achieving other advantages as may be taught or suggested herein.

BRIEF DESCRIPTION OF THE DRAWINGS

Throughout the drawings, reference numbers are re-used to indicate correspondence between referenced elements.

The drawings are provided to illustrate embodiments of the inventive subject matter described herein and not to limit the scope thereof.

FIG. 8 illustrates another embodiment of a system-in-a-package for use in a wireless device, according to certain embodiments.

FIG. 9A illustrates an exemplary packaged crystal, according to certain embodiments.

FIG. 9B illustrates another embodiment of a system-in-a-package, according the certain embodiments.

DETAILED DESCRIPTION

Figure 1A:
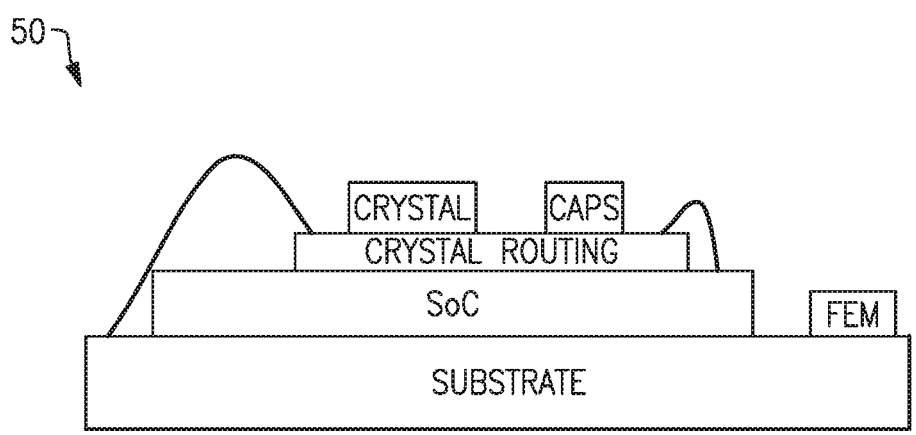
FIG. 1A illustrates an embodiment of a system-in-a-package for use in a wireless device with a crystal stacked over a SoC, according to certain embodiments.

FIG. 1A illustrates an embodiment of a system-in-a-package (SiP) 50 for use in a wireless device. SiP 50 comprises a crystal stacked over a SoC to save space and provide shorter crystal traces. SiP 50 further comprises a packaging substrate, one or more load capacitors, a routing substrate, and a plurality of wire bonds that electrically connect the crystal to the SoC. In an embodiment, the plurality of wire bonds electrically connects the crystal to a crystal oscillator circuit on the SoC. SiP 50 illustrates one embodiment of a space saving SiP. Details of SiP 50 and other SiP embodiments are disclosed herein.

Figure 1B:
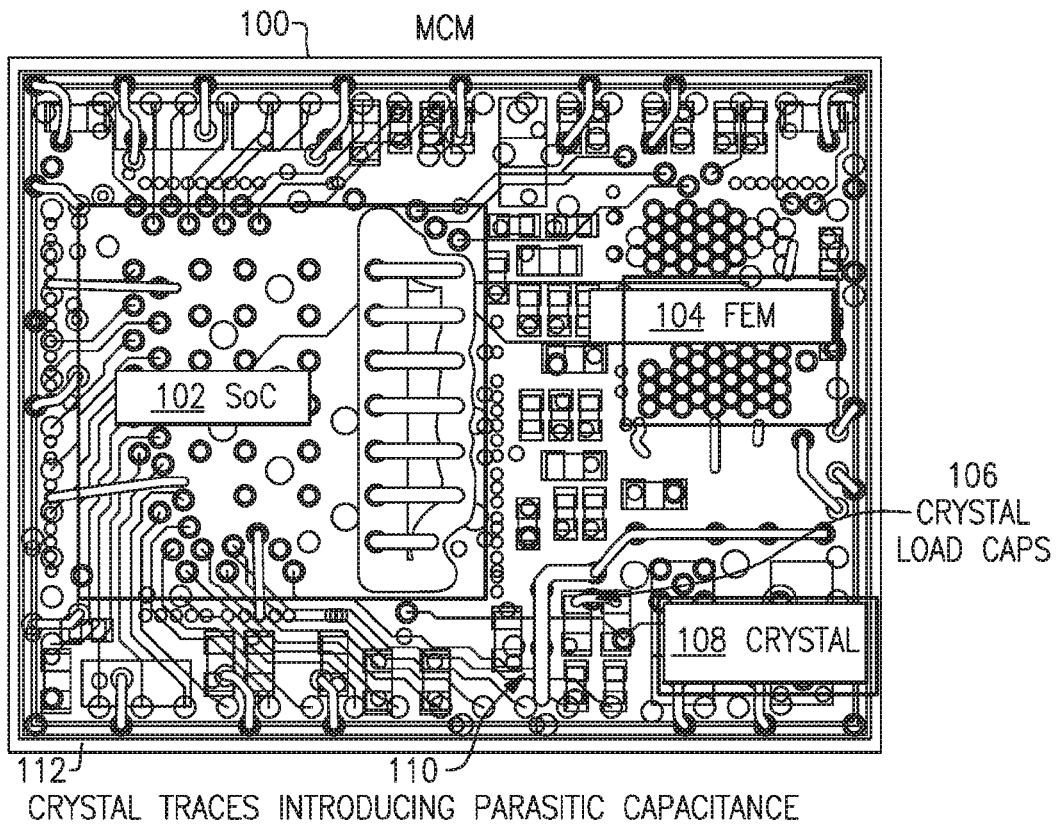
FIGS. 1B-1D illustrate a top view, a block diagram, and a side view, respectively, of a multi-chip module, according to certain embodiments.

FIG. 1B illustrates an exemplary top view of an embodiment of a multi-chip module (MCM) 100 comprising a system-in-a-chip (SoC) 102, a front-end integrated circuit (FEIC)/front-end module (FEM) 104, a crystal 108, and crystal load capacitors 106, and other surface mount devices on a substrate 112, which comprises traces and other interconnect devices to electrically connect the SMT components and components 102, 104, 106, 108. In an embodiment, the crystal 108 and the crystal load capacitors 106 form at least a portion of a crystal oscillator. FEIC and FEM are used interchangeably herein.

FIG. 1B further illustrates long crystal traces 110 providing electrical communication between the crystal 108 and the SoC 102. Due to the horizontal layout of the MCM 100, the crystal traces 110 are susceptible to introducing parasitic capacitance to the MCM circuitry and increase coupling between the crystal routing traces 110 and other sensitive paths on the substrate 112. The parasitic capacitance can adversely affect the startup margin. The startup margin is the ability of the crystal to start oscillating at power up, and is defined as R/ESR, where R is the maximum series resistance added to the crystal path that allows oscillation and ESR is the equivalent series resistance of the crystal.

Figure 1C:
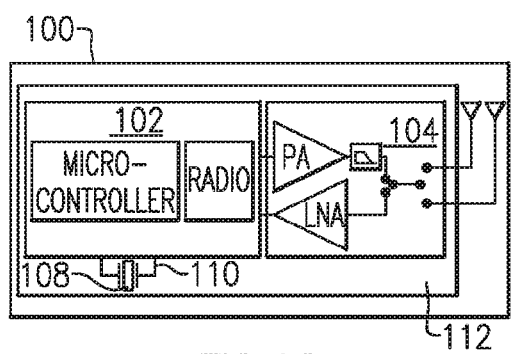

FIG. 1C is an exemplary block diagram of the MCM 100 and illustrates the MCM 100 comprising the SoC 102, which comprises at least a microprocessor and a radio. The MCM 100 further comprises the FEIC 104 which comprises at least one of a power amplifier (PA), a low noise amplifier (LNA), and a double pole double throw switch. The MCM 100 further comprises the crystal 108.

Figure 1D:
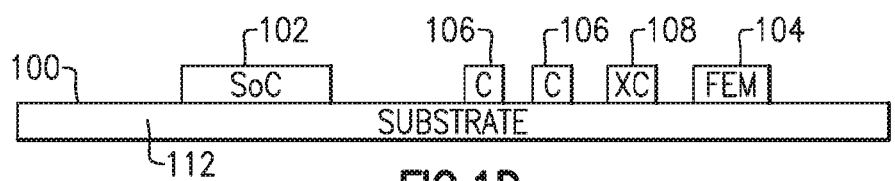

FIG. 1D is an exemplary side view of the MCM 100 and illustrates the horizontal layout of the SoC 102, the FEIC 104, the load capacitors 106, and the crystal 108 on the substrate 112.

In an embodiment, a multi-chip module (MCM) comprises an electronic assembly, such as a package with a number of conductor terminals or "pins", where multiple integrated circuits (ICs), semiconductor dies and/or other discrete components are integrated, usually onto a unifying substrate, so that in use it is treated as if it were a single component as though a larger IC.

In an embodiment, a system on a chip or system on chip (SoC) is an integrated circuit (IC) that integrates all components of a computer or other electronic system into a single chip. It may comprise digital, analog, mixed-signal, and radio-frequency functions on a single chip substrate.

In an embodiment, a front-end integrated circuit (FEIC) or a front-end module (FEM) comprises at least one of a power amplifier (PA), a low noise amplifier (LNA), and a double pole double throw switch. In an embodiment, the RF front end comprises the circuitry between the antenna up to and including the mixer stage, such that the RF front-end comprises the components in the receiver that process the signal at the original incoming radio frequency (RF), before it is converted to a lower intermediate frequency (IF).

In an embodiment, RF front end circuitry uses a local oscillator (LO) which generates a radio frequency signal at an offset from the incoming signal, which is mixed with the incoming signal. In an embodiment, the LO comprises a crystal oscillator, which comprises an electronic oscillator circuit that uses the mechanical resonance of a vibrating crystal of piezoelectric material to create an electrical signal with a precise frequency.

In an embodiment, a crystal oscillator is an electronic oscillator circuit that uses a piezoelectric resonator, such as a crystal, as its frequency-determining element. Crystal is the common term used in electronics for the frequency-determining component, a wafer of quartz crystal or ceramic with electrodes connected to it. In an embodiment, a more accurate term for the frequency determining component is piezoelectric resonator.

Load capacitors are associated with the crystal and function to approximately match the total capacitance seen from the crystal looking into the crystal oscillator circuit, in order to operate the crystal at a desired frequency.

In an embodiment, crystals comprise separate components for use in crystal oscillator circuits. In an embodiment, the crystal is packages with the load capacitors. In other embodiments, a crystal oscillator comprises the crystal, the load capacitors, and an amplifier incorporated in a single package with the crystal oscillator circuit.

In an embodiment, a system-in-package or system-in-a-package (SiP) comprises one or more integrated circuits enclosed in a single module or package. Dies containing integrated circuits may be stacked vertically on a substrate. They can be internally connected by wire bonds that are bonded to the package. Alternatively, with a flip chip technology, solder bumps are used to join stacked chips together.

In an embodiment, SiP dies can be stacked vertically or tiled horizontally, unlike slightly less dense multi-chip modules, which place dies horizontally on a carrier. In an embodiment, a SiP connects the dies with standard off-chip wire bonds or solder bumps, unlike slightly denser three-dimensional integrated circuits which connect stacked silicon dies with conductors running through the die.

Novel 3-D packaging techniques are disclosed herein for stacking many chip dies and passive components, such as capacitors and resistors, into a compact area on a substrate. Novel embodiments to stack a SoC and a crystal are disclosed herein. Further, various novel stacking assemblies and novel stacking configurations are disclosed within. FIGS. 2-17 illustrate various embodiments of a system-in-a-package. In an embodiment, FIGS. 2-17 illustrate various embodiments of a system-in-a-package for use in a wireless device.

Figure 2:
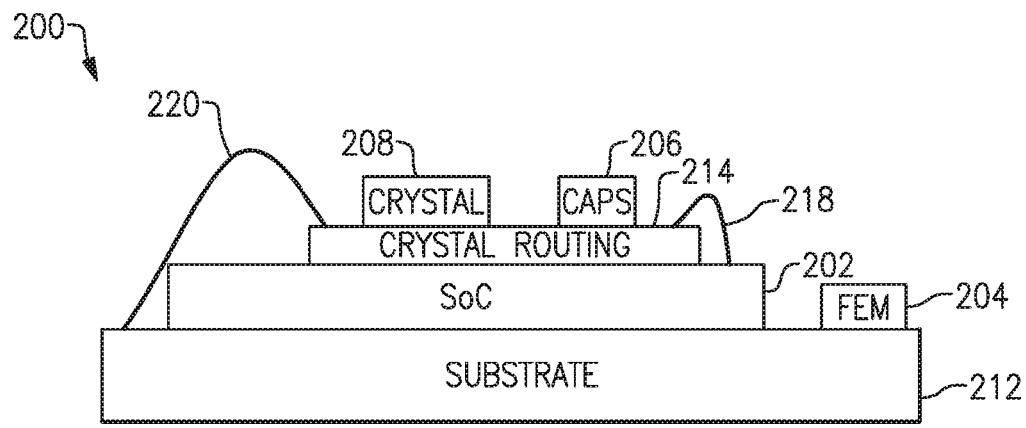
FIG. 2 illustrates an embodiment of a system-in-a-package for use in a wireless device, according to certain embodiments.

FIG. 2 illustrates an embodiment of a system-in-a-package (SiP) 200 for use in a wireless device. SiP 200 comprises a SoC 202, a FEIC 204, a packaging substrate 212, a crystal 208, one or more load capacitors 206, a routing substrate or interposer 214, one or more ground bond wires 220, and one or more wire bonds 218 that electrically connect the crystal 208 to the SoC 202. In an embodiment, the one or more wire bonds 218 electrically connect the crystal 208 to a crystal oscillator circuit on the SoC 202.

FIG. 2 shows the one or more load capacitors 206 as being external to the SoC 202. In other embodiments, the SoC 202 comprises the one or more load capacitors 206.

The SoC 202 is epoxied to the substrate 212 and wire bonded to the substrate 212 in a manner as is known to one of skill in the art of semiconductor fabrication from the disclosure herein. The routing substrate 214 is stacked on top of the SoC 202. The crystal 208 and its load capacitors 206 are then soldered on the top of the routing substrate 214.

The routing substrate 214 holds the crystal 208 and the capacitors 206 and routes signals to the crystal 208. In an embodiment, the routing substrate 214 comprises a single layer or a multi-layer laminate.

In an embodiment, the one or more ground bond wires 220 are in communication with a ground signal, such as a ground plane, a grounded via or the like, on the substrate 212 and the routing substrate 214, which in turn routes the ground signal to the crystal 208. In an embodiment, the one or more wire bonds 218 are in communication with devices, such as a crystal oscillator or the like, on the SoC 202 and the routing substrate 214, which in turn, routes the signals to the crystal 208.

Stacking the crystal 208 and the capacitors 206 permits the substrate 212 be smaller (have a smaller footprint) than the substrate 112 and provides the same or similar functionality. The advantage of stacking the crystal 208 and the capacitors 206 is not only space savings, but also the length of at least one trace between the crystal 208 and the SoC 202 has been greatly reduced. It is desirable to have as short a trace as possible between a crystal and a SoC to reduce parasitic capacitance of the trace. By stacking the crystal 208 over the SoC 202, the trace is all but eliminated and the opportunity for parasitic capacitance to develop is greatly reduced. In an embodiment, the signals to/from the crystal 208 are routed from the SoC 202 directly to the routing substrate 214 via the one or more wire bonds 218. Another benefit of reducing the traces in communication with the crystal 208 is a reduced opportunity of coupling between the crystal path and other sensitive paths on the substrate 212, such as RF traces that are in communication with the FEIC 204, for example.

Figure 3:
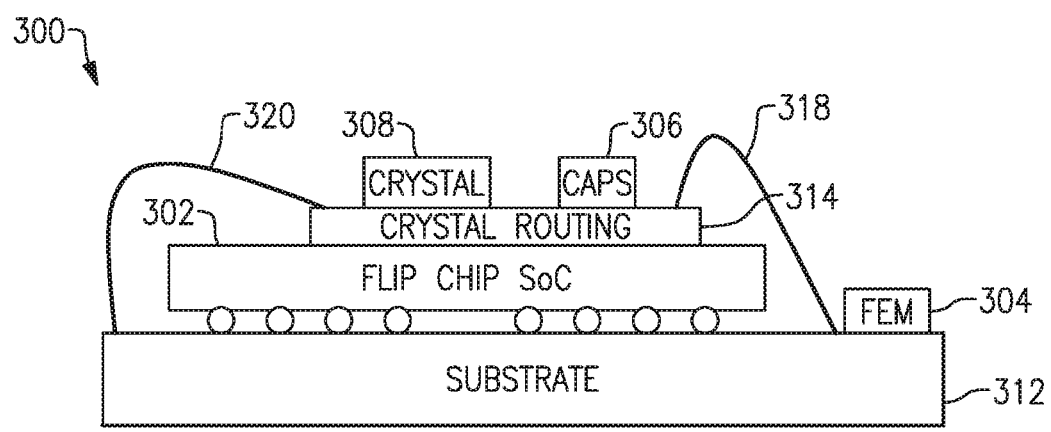
FIG. 3 illustrates another embodiment of a system-in-a-package for use in a wireless device, according to certain embodiments.

FIG. 3 illustrates an embodiment of a system-in-a-package 300 for use in a wireless device. SiP 300 comprises a SoC 302, a FEIC 304, a packaging substrate 312, a crystal 308, one or more load capacitors 306, a routing substrate 314, one or more ground bond wires 320, and one or more wire bonds 318 that electrically connect the crystal 308 to the SoC 302. In an embodiment, the one or more wire bonds 318 electrically connect the crystal 308 to a crystal oscillator on the SoC 302.

The SiP 300 is similar to the SiP 200 except that the SoC 302 comprises a flip chip package. The SoC 302 is soldered to the substrate 312 in a manner as is known to one of skill in the art of semiconductor fabrication from the disclosure herein. Similar to the stacking arrangement of the SiP 200, the routing substrate 314 is stacked on top of the SoC 302 and the crystal 308 and its load capacitors 306 are then soldered on the top of the routing substrate 314. In an embodiment, the SoC 302 is immediately adjacent to the substrate 312 and to the routing substrate 314; and the crystal 308 is immediately adjacent to the routing substrate 314. Advantageously, the SiP 300 provides space savings, reduced length of traces in the crystal path, decreased parasitic capacitance, and decreased signal coupling.

Figure 4:
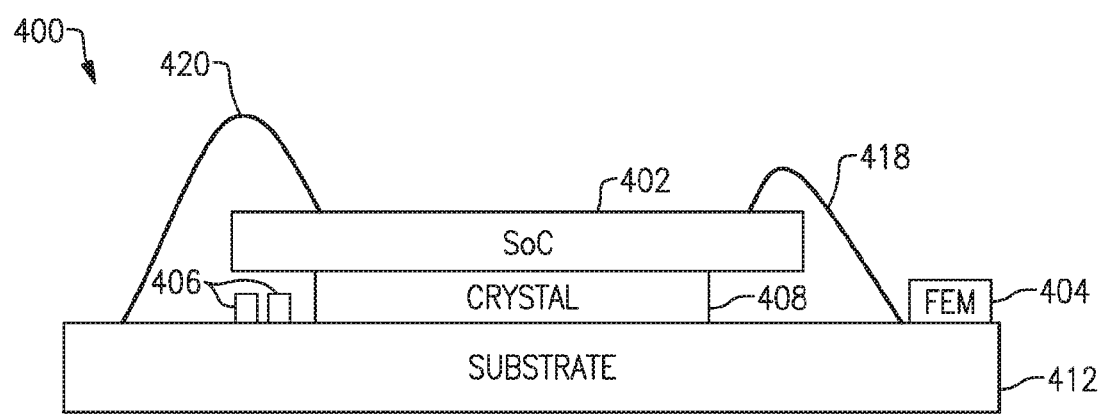
FIG. 4 illustrates another embodiment of a system-in-a-package for use in a wireless device, according to certain embodiments.

FIG. 4 illustrates an embodiment of a system-in-a-package 400 for use in a wireless device. SiP 400 comprises a SoC 402, a FEIC 404, a packaging substrate 412, a crystal 408, one or more load capacitors 406, one or more wire bonds 420 that electrically connect signals from the SoC 402 to traces on the substrate 412, and one or more wire bonds 418 that electrically connect signals associated with the crystal 408 to signals associated with the SoC 402 via routing traces on the substrate 412. In the SiP 400, the crystal 408 is over the substrate 412 and the SoC 402 is stacked directly over the crystal 408, without a routing substrate between the SoC 402 and the crystal 408. In an embodiment, the crystal 408 is immediately adjacent to the SoC 402 and the substrate 412. In an embodiment, the footprint of the SoC 402 is larger than the footprint of the crystal 408, which creates an overhang volume that is bounded by the sides of the crystal 408, the portion of the SoC 402 that extends beyond crystal 408, and the portion of the substrate 412 that is within the footprint of the SoC 402 and not covered by the crystal 408.

In an embodiment, the load capacitors 406 and/or the FEIC 404 are placed outside of the SoC footprint. In another embodiment, the load capacitors 406 and/or the FEIC 404 are placed between the SoC 402 and the crystal 408 within the SoC footprint. In another embodiment, the load capacitors 406 and/or the FEIC 404 are placed within the overhang volume.

There are several factors to consider when utilizing the overhang volume. Factors to consider include, but are not limited to the thickness of the SoC, bond wire types, an amount of pressure used to bond the bond wire to the SoC without cracking the SoC, an amount of overhang that can be supported, and the like.

Figure 5A:
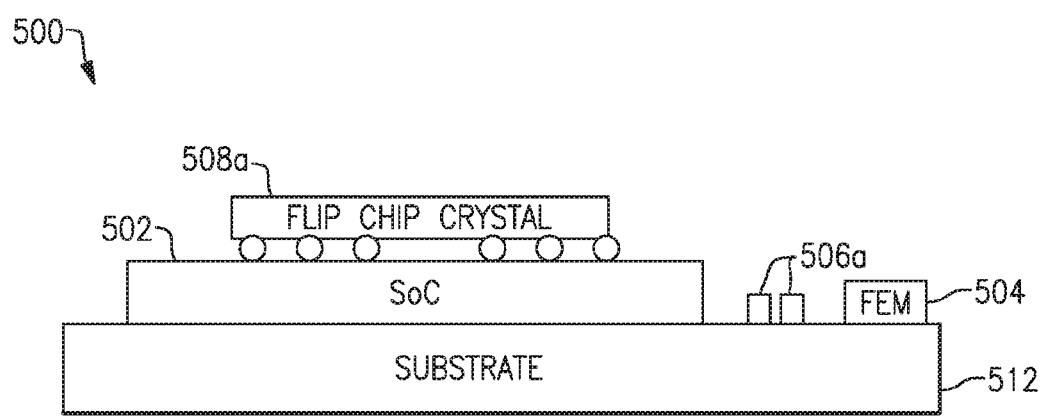
FIG. 5A illustrates another embodiment of a system-in-a-package for use in a wireless device, according to certain embodiments.

FIG. 5A illustrates another embodiment of a system-in-a-package 500 for use in a wireless device. SiP 500 comprises a SoC 502, a FEIC 504, a packaging substrate 512, a crystal 508a, and one or more load capacitors 506a. The crystal 508a comprises a flip chip or controlled collapse chip connection (C4) package and is stacked over the SoC 502, which is over the substrate 512. In an embodiment, the FEIC 504 and the load capacitors 506a are placed on the substrate 512 beside the SoC 502.

In an embodiment, the crystal 508 is soldered to the SoC 502 through the solder bumps of the flip chip package to matching pads on the SoC 502. In an embodiment, there are no wire bonds between the crystal 508 and the SoC 502. In an embodiment, when the crystal 508 is soldered to the SoC 502, the crystal 508 and the SoC 502 are in electrical communication, such that a length of a trace between the crystal 508 and a crystal oscillator on the SoC 502 is very short.

Figure 5B:
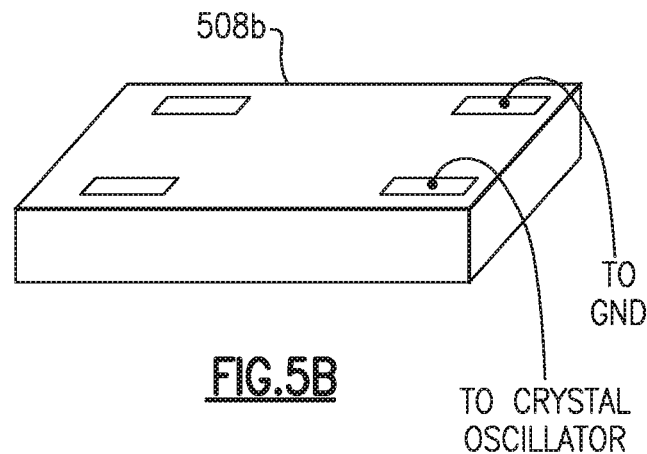
FIG. 5B illustrates another embodiment of a surface mount crystal for use in a system-in-a-package, according to certain embodiments.

FIG. 5B illustrates another embodiment of a surface mount crystal 508b for use in a system-in-a-package. In this embodiment, the crystal 508b is flipped on its back, such that the crystal bond pads are up. The top of the package of the crystal 508b is bonded or epoxied to the layer below. In an embodiment, the layer below the crystal 508b comprises a SoC. In another embodiment, the layer below the crystal 508b comprises the substrate. Bond wires from the bond pads of the crystal 508b bond down to connect ground, crystal oscillator connections, load caps, and the like.

Figure 5C:
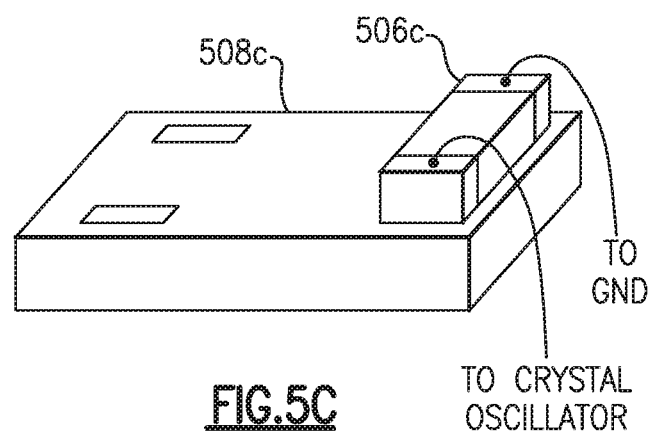
FIG. 5C illustrates another embodiment of a surface mount crystal for use in a system-in-a-package, according to certain embodiments.

FIG. 5C illustrates another embodiment of a surface mount crystal 508c and at least one surface mount load capacitor 506c for use in a system-in-a-package. In this embodiment, the crystal 508c is flipped on its back, such that the crystal bond pads are up. The top of the package of the crystal 508c is bonded or epoxied to the layer below. In an embodiment, the layer below the crystal 508c comprises a SoC. In another embodiment, the layer below the crystal 508c comprises the substrate. The surface mount load capacitor 506c is bonded directly onto the crystal bond pads of the flipped crystal 508c. Bond wires from the bond pads of the surface mount load capacitor 506c bond down to connect ground, crystal oscillator connections, and the like.

Figure 5D:
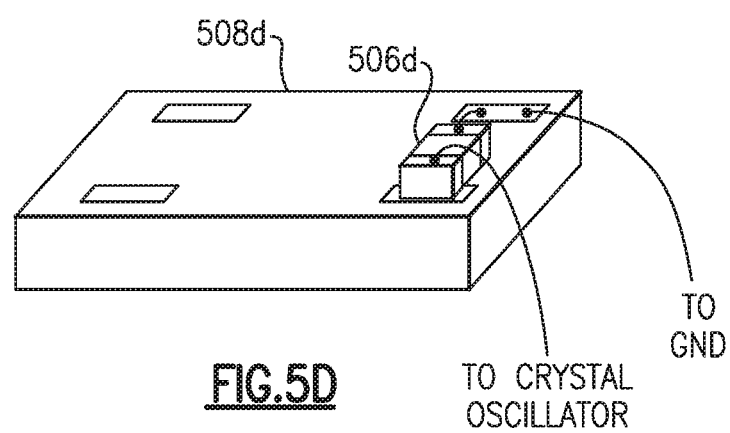
FIG. 5D illustrates another embodiment of a surface mount crystal for use in a system-in-a-package, according to certain embodiments.

FIG. 5D illustrates another embodiment of a surface mount crystal 508d and at least one surface mount load capacitor 506d for use in a system-in-a-package. In this embodiment, the crystal 508d is flipped on its back, such that the crystal bond pads are up. The top of the package of the crystal 508d is bonded or epoxied to the layer below. In an embodiment, the layer below the crystal 508d comprises a SoC. In another embodiment, the layer below the crystal 508d comprises the substrate. In this embodiment, the surface mount load capacitor 506d is too small to bridge the gap between the bond pads on the crystal 508d. A bond wire from the bond pad of the surface mount load capacitor 506d to the bond pad of the crystal 508d bridges the gap between the bond pads on the crystal 508d. A bond wire from the bond pad of the surface mount load capacitor 506d and a bond wire from the bond pad of the crystal 508d bond down to connect ground, crystal oscillator connections, and the like.

In other embodiments, the crystal 508b, the crystal 508c and the surface mount load capacitor 506c, or the crystal 508d and the load capacitor 506d are flipped such that the bond pads of the crystal 508b, the crystal 508c and the surface mount load capacitor 506c, or the crystal 508d and the load capacitor 506d are down and set directly on a SoC or a substrate.

Figure 6:
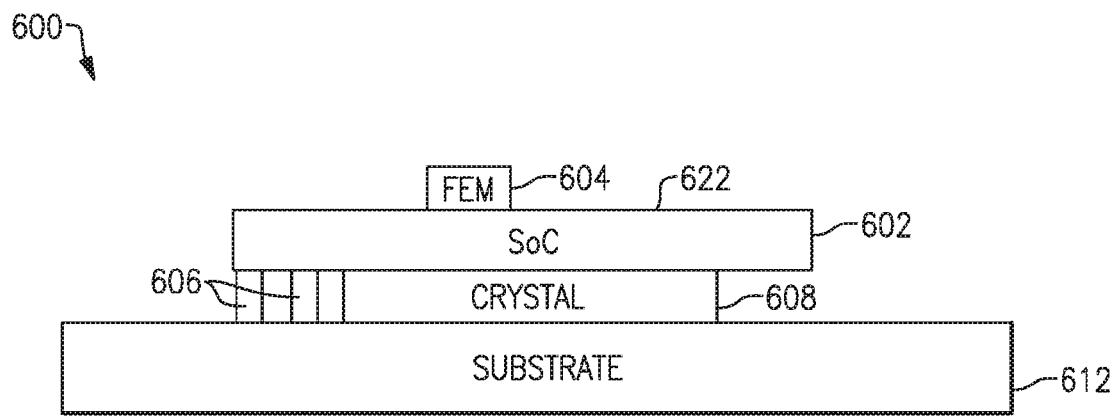
FIG. 6 illustrates another embodiment of a system-in-a-package for use in a wireless device, according to certain embodiments.

FIG. 6 illustrates another embodiment of a system-in-a-package 600 for use in a wireless device. SiP 600 comprises a SoC 602, an FEIC 604, a packaging substrate 612, a crystal 608, and one or more load capacitors 606. The crystal 608 is over the substrate 612, the SoC 602 is over the crystal 608, and the FEIC 604 is over the SoC 602. The SiP 600 further comprises a ground plane 622 between the FEIC 604 and the SoC 602. In an embodiment, the footprint of the SoC 602 is larger than the footprint of the crystal 608, which creates an overhang volume that is bounded by the sides of the crystal 608, the portion of the SoC 602 that extends beyond crystal 608, and the portion of the substrate 612 that is within the footprint of the SoC 602 and not covered by the crystal 608. In an embodiment, the load capacitors 606 are placed between the substrate 612 and the SoC 602 in the footprint of the SoC 602 to save space. In an embodiment, the load capacitors 606 are placed in the overhang volume.

Figure 7:
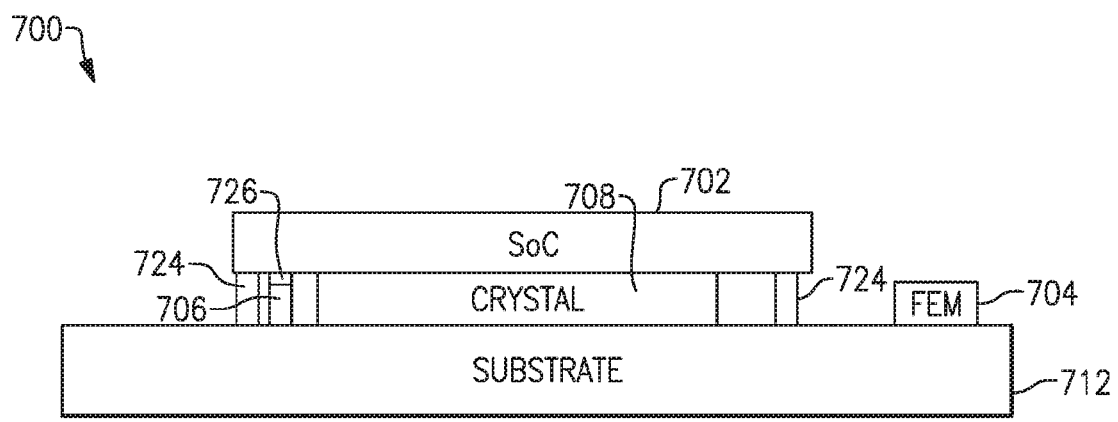
FIG. 7 illustrates another embodiment of a system-in-a-package for use in a wireless device, according to certain embodiments.

FIG. 7 illustrates another embodiment of a system-in-a-package 700 for use in a wireless device. SiP 700 comprises a SoC 702, an FEIC 704, a packaging substrate 712, a crystal 708, one or more load capacitors 706, and one or more supports 724. The crystal 708 is over the substrate 712 and the SoC 702 is over the crystal 708. In an embodiment, the SoC 702 is immediately adjacent to the crystal 708; and the crystal 708 is immediately adjacent to the substrate 712. In an embodiment, the footprint of the SoC 702 is larger than the footprint of the crystal 708, which creates an overhang volume that is bounded by the sides of the crystal 708, the portion of the SoC 702 that extends beyond crystal 708, and the portion of the substrate 712 that is within the footprint of the SoC 702 and not covered by the crystal 708.

Supports 724 are placed between the SoC 702 and the substrate 712, near the crystal 708, to provide support for the SoC 702. In an embodiment, the supports 724 are placed in the overhang volume. In an embodiment, the support 724 comprises conductive material, such as copper and the like, and electrically connects a ground pad on the SoC 702 with a ground trace or ground plane of the substrate 712, in addition to providing mechanical support. In another embodiment, the support 724 electrically connects a signal other than ground to a pad or trace on the substrate 712.

In an embodiment, the load capacitors 706 are placed in the footprint of the SoC 702 and near the crystal 708. In an embodiment, the load capacitors 706 are placed in the overhang volume. In an embodiment, the height of the load capacitors 706 is less than the space between the SoC 702 and the substrate 712. To increase the height of the capacitors 706, a shim or spacer 726 is placed on top of the load capacitors 706 to fill the space between the load capacitors 706 and the SoC 702. The spacer 726 plus the load capacitors 706 provides support for the SoC 702. Further, the spacer 726 can be used to compensate for any tilt that may occur do to stacking uneven components as such tilt can cause manufacturing problems when assembling the SiP 200, 300, 400, 500, 600, 700. In an embodiment, the spacer 726 can be placed over or under any other component that is tucked in the space between the SoC 702 and the substrate 712.

FIG. 8 illustrates another embodiment of a system-in-a-package 800 for use in a wireless device. SiP 800 comprises a SoC 802, an FEIC 804, a packaging substrate 812, a crystal 808, one or more load capacitors 806, and one or more supports 824. The crystal 808 is over the substrate 812 and the SoC 802 is over the crystal 824. In an embodiment, the footprint of the SoC 802 is larger than the footprint of the crystal 808, which creates an overhang volume that is bounded by the sides of the crystal 808, the portion of the SoC 802 that extends beyond crystal 808, and the portion of the substrate 812 that is within the footprint of the SoC 802 and not covered by the crystal 808.

The supports 824 are placed between the SoC 802 and the substrate 812, near the crystal 808, to provide support for the SoC 802. In an embodiment, the supports 824 are placed in the overhang volume. In an embodiment, the load capacitors 806 are placed in the footprint of the SoC 802 and near the crystal 808. In an embodiment, the load capacitors 806 are placed in the overhang volume. Further, the FEIC 804 is under the substrate 812 on an opposite side of the substrate 812 from the crystal 808.

In an embodiment, the packaging substrate 212, 312, 412, 512, 612, 712, 812 comprises a substrate, a laminate, a multi-layer laminate, an interposer, and the like, and is configured to provide a physical connection and traces for signal routing for at least one component of the SiP 200, 300, 400, 500, 600, 700, 800, respectively.

In an embodiment, the SoC 202, 302, 402, 502, 602, 702, 802 comprises a baseband subsystem and radio for a portable wireless device. In an embodiment, the radio comprises a receiver and a transmitter. In an embodiment, the baseband subsystem comprises a microprocessor configured to receive a clocking function. In other embodiments, the SoC 202, 302, 402, 502, 602, 702, 802 comprises an integrated circuit that integrates components of an electronic system into a single chip. In an embodiment, the SoC 202, 302, 402, 502, 602, 702, 802 may comprise one or more of digital, analog, mixed-signal, and RF functions. The EM358x by Silicon Labs, Austin Tex., is an example of a SoC that integrates a processor, a transceiver, memory, and serial communication on an IC.

In an embodiment, the FEIC 204, 304, 404, 504, 604, 704, 804 comprises a front-end system, such as SKY65249-11 by Skyworks Solutions, Woburn, Mass., for example, which comprises a power amplifier, an input filter, a power detector, harmonic filters, and a switch in a laminate package. In other embodiments, the FEIC 204, 304, 404, 504, 604, 704, 804 comprises other front-end modules.

FIG. 9A illustrates an exemplary packaged crystal 908 comprising a housing or case 932, a lid 930, and one or more pillars or vias 934 along one or more sides of the case 932. In an embodiment, the pillars or vias 934 comprise a conductive material, such as solder, metal, copper, gold, nickel gold-plated metal, and the like. The pillars or vias 934 are formed from a top surface of the case 932 to a bottom surface of the case 932 and provide electrical and/or thermal conduction. In a further embodiment, the pillars or vias 934 are in electrical communication with corresponding pads formed on the top surface of the case 932. In another embodiment, the case 932 is formed with one or more tubes along one or more sides of the case 932, such that filling the tubes with solder forms the pillars or vias 934.

FIG. 9B illustrates another embodiment of a system-in-a-package 900 comprising the packaged crystal 908 and a SoC 902 immediately adjacent to the crystal 908. In an embodiment, the SoC 902 comprises a flip chip that includes solder bumps, such that when the SoC 902 is soldered to the pads of the crystal 908, the solder bumps are in electrical communication with the pillars or vias 934.

In an embodiment, the crystal 208, 308, 408, 508, 608, 708, 808, 908 is packaged without load capacitors. In another embodiment, the crystal 208, 308, 408, 508, 608, 708, 808, 908 is packaged with load capacitors. In a further embodiment, the crystal 208, 308, 408, 508, 608, 708, 808, 908 forms at least a part of a crystal oscillator.

In an embodiment, the crystal 208, 308, 408, 508, 608, 708, 808, 908 comprises a CX2016DB16000D0HZLC1 by Kyocera, Yamagata, Japan. In an embodiment, the crystal 208, 308, 408, 508, 608, 708, 808 is approximately 1.60±0.10 mm by approximately 2.00±0.10 mm. In other embodiments, the length of the crystal 208, 308, 408, 508, 608, 708, 808, 908 is larger or smaller than 1.60±0.10 mm, and the width of the crystal 208, 308, 408, 508, 608, 708, 808, 908 is larger or smaller than 2.00±0.10 mm.

Table 1 illustrates exemplary ratings and Table 2 illustrates exemplary electrical characteristics for an embodiment of the crystal 208, 308, 408, 508, 608, 708, 808, 908.

TABLE 1

RATINGS

| Items | SYMB. | Rating | Unit |
|---|---|---|---|
| Operating Temperature Range | Topr | −25 to +75 | ° C. |
| Storage Temperature Range | Tstg | −40 to +85 | ° C. |

TABLE 2

ELECTRICAL CHARACTERISTICS

| | | Electrical Specification | | | | |
|---|---|---|---|---|---|---|
| Items | SYMB. | Min | Typ. | Max | Unit | Test Condition |
| Mode of Vibration | | | Fundamental | | | |
| Nominal Frequency | F0 | | 16 | | MHz | |
| Nominal Temperature | $T_{NOM}$ | | +25 | | ° C. | |
| Load Capacitance | CL | | 8.0 | | pF | |
| Frequency Tolerance | df/F | −20.0 | | +20.0 | PPM | +25 ± 3° C. |
| Frequency Temperature Characteristics | df/F | −20.0 | | +20.0 | | −25 to +75° C. |
| Frequency Aging Rate | | −1.0 | | +1.0 | | 1st Year +25 ± 3° C. |
| Equivalent Series Resistance | ESR | | | 150 | Ω | |
| Drive Level | Pd | | 0.01 | 100 | µW | |

TABLE 2-continued

ELECTRICAL CHARACTERISTICS

| | | Electrical Specification | | | | |
|---|---|---|---|---|---|---|
| Items | SYMB. | Min | Typ. | Max | Unit | Test Condition |
| Insulation Resistance | IR | 500 | | | MΩ | 100 V(DC) |

As indicated in Table 2, the equivalent series resistance (ESR) of the crystal 208, 308, 408, 508, 608, 708, 808, 908 is approximately 150 ohms. In another embodiment, the ESR is approximately 100 ohms. In a further embodiment, ESR is between approximately 100 ohms and approximately 200 ohms. In another embodiment, the ESR is between approximately 75 ohms and approximately 200 ohms, between approximately 75 ohms and approximately 150 ohms, between approximately 75 ohms and approximately 100 ohms, less than approximately 200 ohms, less than approximately 150 ohms, less than approximately 100 ohms, or less than approximately 75 ohms.

In other embodiments, the crystal 208, 308, 408, 508, 608, 708, 808, 908 comprises other crystals with different specifications.

FIGS. 10-16 illustrate exemplary novel stacking options for passive components, surface mount devices (SMD), integrated circuits, stacked assemblies, laminates, and combinations thereof.

Figure 10:
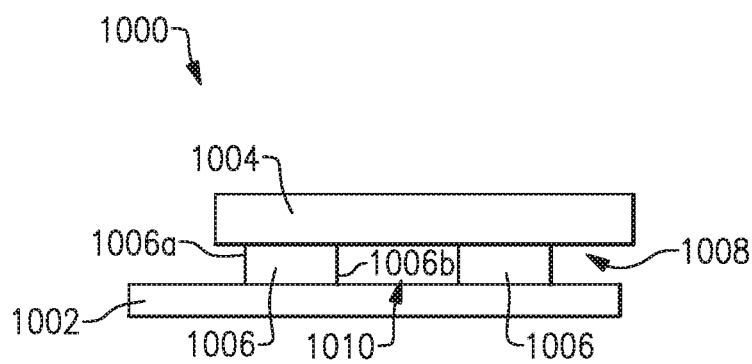
FIG. 10 illustrates an exemplary stacked assembly including supports, according to certain embodiments.

FIG. 10 illustrates an exemplary stacked assembly 1000 that comprises a bottom layer 1002, a top layer 1004 positioned over the bottom layer 1002, and one or more supports 1006 in between the top layer 1004 and the bottom layer 1002 to provide support for the top layer 1004. In an embodiment, one end of the support 1006 is immediately adjacent to the bottom layer 1002 and an opposite end of the support 1006 is immediately adjacent to the top layer 1004.

The supports 1006 can be positioned such that an overhang 1008 is formed on at least both sides of the assembly 1000 between an outside 1006a of the support 1006, the bottom layer 1002, and the top layer 1004. Further, the supports 1006 can be positions such that a cavity 1010 is formed between insides 1006b of the supports 1006, the bottom layer 1002, and the top layer 1004.

The bottom layer 1002 can be, for example, a laminate, an IC, a die, a surface mount device, a crystal, a SoC, or the like. In an embodiment, an IC, a die, a flip-chip die, a wirebond die, a surface mount device, a crystal, SoC, and an assembly, for example, can be placed within the overhang 1008 and immediately adjacent to the bottom layer 1002. In another embodiment, an IC, a die, a flip-chip die, a wirebond die, a surface mount device, a crystal, SoC, and an assembly, for example, can be placed within the cavity 1010 and immediately adjacent to the bottom layer 1002. In a further embodiment, the assembly within the cavity 1010 or the overhang 1008 can be any of the assemblies described herein.

The top layer 1004 can be, for example, a laminate, an IC, a die, a surface mount device, a crystal, a SoC, or the like. In a further embodiment, the laminate comprises a dual sided laminate and either or both sides of the dual-sided laminate can comprise an IC, a die, a surface mount device, a crystal, a SoC, or the like. In embodiment, the top layer 1004 comprises a ball grid array with one or more surface mount devices in communication with a respective one or more solder balls of the ball grid array.

In an embodiment, the support 1006 comprises an IC, a die, a crystal, a surface mount device, a rectangular or cylindrical pillar or post, and the like, to support the top layer 1004. In an embodiment, the support 1006 functions as a mechanical support. In another embodiment, the support 1006 functions as a mechanical support as well as providing an electrical function. For example, a surface mount device, such as a resistor, a capacitor, or an inductor, could form a connection between the bottom layer 1002 and the top layer 1004 and be part of an electrical circuit. In another embodiment, the support 1006 comprises a conductive material and forms a ground connection between the bottom layer 1002 and the top layer 1004.

FIGS. 11A-11D illustrates exemplary bonding configurations from a bond source 1802 to surface mount devices 1812, 1832, 1842, 1852. In an embodiment, the bond source 1802 comprises a die, an IC, a surface mount device, a laminae or any other item that a first end of a wire bond can be bonded to as is known to one of skill in the art of semiconductor fabrication from the disclosure herein. In an embodiment, bond source 1802 is immediately adjacent to a laminate 1804. In an embodiment, laminate 1804 is configured to further route signals traveling along one or more of the surface mount connections of FIGS. 11A-11D.

Figures 11A, 11B, 11C, 11D:
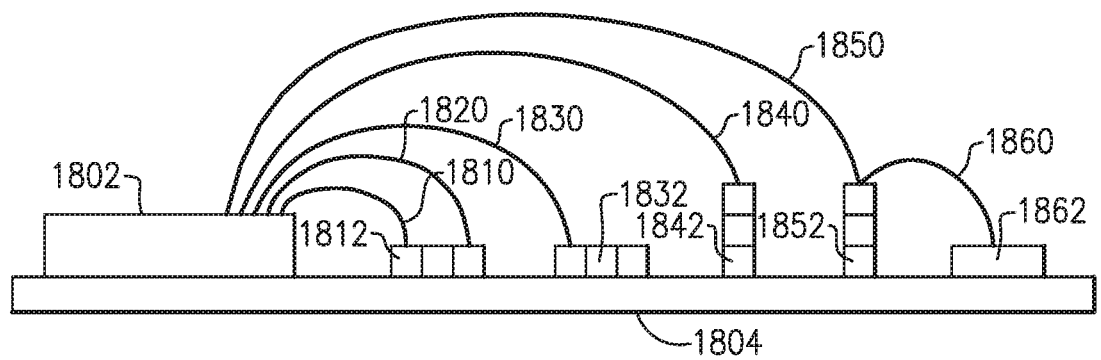
FIG. 11A-11D illustrates exemplary bonding configurations for surface mount devices, according to certain embodiments.

FIG. 11A illustrates a first wire bond 1810 bonded between the bond source 1804 and a first end of the horizontally oriented surface mount device 1812, and a second wire bond 1820 bonded between the bond source 1804 and a second end of the surface mount device 1812 to form a series connection between the bond source 1804 and the surface mount device 1812.

FIG. 11B illustrates a third wire bond 1830 bonded between the bond source 1804 and a first end of the horizontally oriented surface mount device 1832, where a second end of the surface mount device 1832 is in electrical communication with traces or pads formed on the laminate 1802.

FIG. 11C illustrates a fourth wire bond 1840 bonded between a first end of the vertically oriented surface mount device 1842 where a second end of the surface mount device 1842 is in electrical communication with traces or pads formed on the laminate 1802.

FIG. 11D illustrates a fifth wire bond 1850 bonded between a first end of the vertically oriented surface mount device 1852 and a sixth wire bond 1860 bonded between the first end of the surface mount device 1852 and bondable device 1862 to form a shunt or parallel connection between the surface mount device 1852 and the bondable device 1862. In an embodiment, the surface mount device 1852 is mounted on the laminate 1804 in a vertical position, as illustrated. In another embodiment, the surface mount device 1852 is mounted on the laminate 1804 in a horizontal position. In an embodiment, the bondable device 1862 comprises the laminate 1804, another surface mount device, a die, an IC, or any device with a bondable surface.

FIGS. 12A-12E illustrate exemplary stacking configurations for surface mount devices.

Figure 12A:
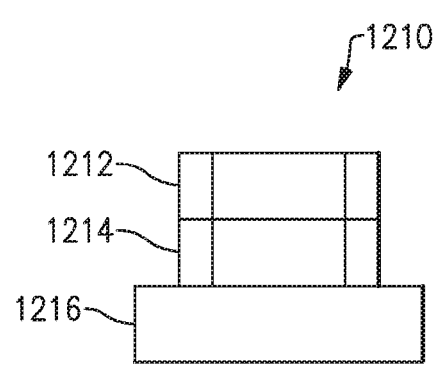
FIG. 12A-12E illustrates exemplary stacking configurations for surface mount devices, according to certain embodiments.

FIG. 12A illustrates a stacking configuration 1210 comprising a first horizontally positioned surface mount device 1212 stacked over and immediately adjacent to a second horizontally positioned surface mount device 1214, where the second surface mount device 1214 is over and immediately adjacent to a bottom surface 1216. In an embodiment, the contacts of the first surface mount device 1212 are in electrical communication with respective contacts of the second surface mount device 1214.

Figure 12B:
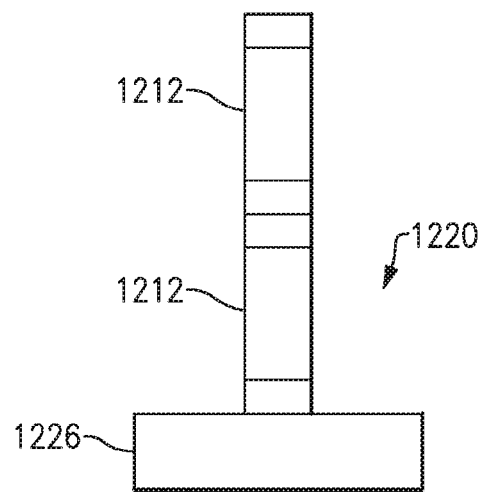

FIG. 12B illustrates a stacking configuration 1220 comprising a first vertically oriented surface mount device 1222 stacked on end over and immediately adjacent to a second vertically oriented surface mount device 1224. A first end of the surface mount device 1222 is in electrical communication with a first end of the second surface mount device 1224, and a second end of the second surface mount device 1224 is over and immediately adjacent to a bottom surface 1226. In an embodiment, the second end of the second surface mount device 1224 is in electrical communication with pads or traces on the bottom surface 1226.

Figure 12C:
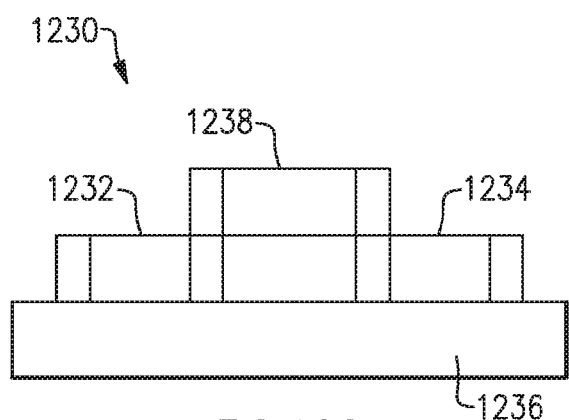

FIG. 12C illustrates a stacking configuration 1230 comprising a horizontally oriented first surface mount device 1232, a horizontally oriented second surface mount device 1234, and a horizontally oriented third surface mount device 1238. In an embodiment, the first surface mount device 1232 and the second surface mount device 1234 are over and immediately adjacent to a bottom surface 1236 and spaced apart such that a first end of the third surface mount device 1238 is stacked over a first end of the first surface mount device 1232 and a second end of the third surface mount device 1234 is stacked over a first end of the second surface mounted device 1234. In an embodiment, the surface mount devices 1232, 1234, 1238 are electrically connected in series. In an embodiment, the stacking configuration 1230 has a smaller footprint than the footprint formed by mounting three surface mount devices on the bottom layer 1236 to form a series connection.

Figure 12D:
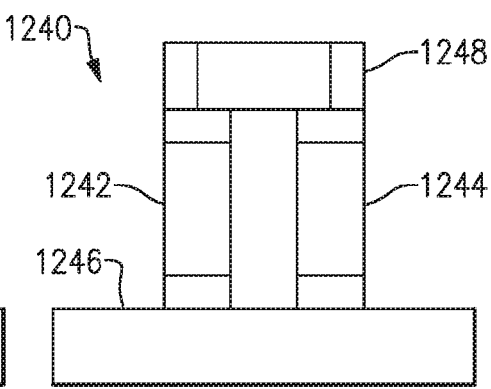

FIG. 12D illustrates a stacking configuration 1240 comprising a first vertically oriented surface mount device 1242, a second vertically oriented surface mount device 1244, and a third horizontally oriented surface mount device 1248. The first surface mount device 1242 is over and immediately adjacent to a bottom layer 1206 such that a first end of the first surface mount device 1242 is in electrical communication with pads or traces on the bottom layer 1246. The second surface mount device 1244 is over and immediately adjacent to the bottom layer 1206 that a first end of the second surface mount device 1242 is in electrical communication with pads or traces on the bottom layer 1246.

Further, the first and second surface mount devices 1242, 1244 are spaced apart such that a first end of the third surface mount device 1248 is over and in electrical communication with a second end of the first surface mount device 1242 and a second end of the third surface mount device 1248 is over and in electrical communication with a second end of the second surface mount device 1244.

In an embodiment, the stacking configuration 1240 comprises a pi (π) filter topology. In an embodiment, the stacking configuration 1240 has a smaller footprint than the footprint formed by mounting three surface mount devices on the bottom layer 1236 to form the pi filter topology.

In another embodiment, the stacking configuration 1240 can be flipped over such that surface mount device 1248 is over the bottom layer 1246, and surface mount devices 1242 and 1244 are over surface mount device 1246.

Figure 12E:
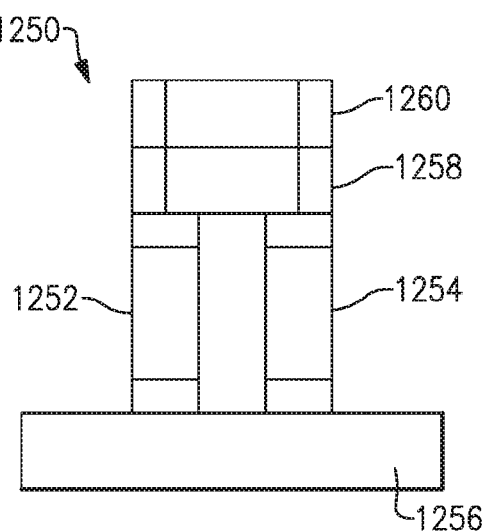

FIG. 12E illustrates a stacking configuration 1250 comprising a first surface mount device 1252, a second surface mount device 1254, a third surface mount device 1258, and a fourth surface mount device 1260. In a first embodiment, as illustrated in FIG. 12E, the first, second, and third surface mount devices 1252, 1254, 1258 form the stacking configuration 1240 over and immediately adjacent to a bottom layer 1256, and the fourth surface mount device 1260 is stacked over and immediately adjacent to the third surface mount device 1258. In an embodiment, pads of the fourth surface mount device 1260 are in electrical communication with corresponding pads of the third surface mount device 1258.

In a second embodiment, not illustrated, the first, second, and third surface mount devices 1252, 1254, 1258 form the stacking configuration 1240 over and immediately adjacent to the bottom layer 1256, and the fourth surface mount device 1260 is stacked beside and immediately adjacent to the third surface mount device 1258 and also over and immediately adjacent to the first and second surface mount devices 1252, 1254. In an embodiment, pads of the fourth surface mount device 1260 are in electrical communication with corresponding pads of the third surface mount device 1258 and the corresponding pads of the first and second surface mount devices 1252, 1254.

In a third embodiment, not illustrated, the first, second, and third surface mount devices 1252, 1254, 1258 form the stacking configuration 1230 over and immediately adjacent to the bottom layer 1256, and the fourth surface mount device 1260 is stacked over and immediately adjacent to the third surface mount device 1258. In an embodiment, pads of the fourth surface mount device 1260 are in electrical communication with corresponding pads of the third surface mount device 1258.

In a fourth embodiment, not illustrated, the first, second, and third surface mount devices 1252, 1254, 1258 form the stacking configuration 1230 over and immediately adjacent to the bottom layer 1256, and the fourth surface mount device 1260 is stacked beside and immediately adjacent to the third surface mount device 1258 and also over and immediately adjacent to the first and second surface mount devices 1252, 1254. In an embodiment, pads of the fourth surface mount device 1260 are in electrical communication with corresponding pads of the third surface mount device 1258 and the corresponding pads of the first and second surface mount devices 1252, 1254.

In another embodiment, the stacking configuration 1250 can be flipped over such that surface mount device 1260 is over the bottom layer 1256, surface mount device 1258 is over surface mount device 1260, and surface mount devices 1252 and 1254 are over surface mount device 1248.

In an embodiment, the stacking configuration 1250 comprises a band-reject or notch filter topology that can be configured to form a notch or reject at specific frequencies. In an embodiment, a stacking configuration that comprises a first stacking configuration 1250 beside a second stacking configuration 1250 such that both the first and second stacking configurations 1250 share surface mount device 1254 comprises a band-reject filter with a notch at two specified frequencies.

In an embodiment, the stacking configuration 1250 has a smaller footprint than the footprint formed by mounting four surface mount devices on the bottom layer 1236 to form the band-reject or notch filter topology. Since any node or pad of any of the surface mount devices 1212, 1214, 1222, 1224, 1232, 1234, 1238, 1242, 1244, 1248, 1252, 1254, 1258, 1260 is configured to be bonded to, additional surface mount devices and/or various combinations of the stacking structures 1210, 1220, 1230, 1240, 1250, for example, can be combined to create structures with more complex topology.

Surface mount devices 1212, 1214, 1222, 1224, 1232, 1234, 1238, 1242, 1244, 1248, 1252, 1254, 1258, 1260 can be, for example, passive components, such as capacitors, resistor, and inductors, discrete semiconductors, such as transistors, diodes, and FETs, integrated circuits, and the like, and can have short pins or leads of various styles, flat contacts, a matrix of solder balls (BGAs), or terminations on the body of the component.

Figure 13:
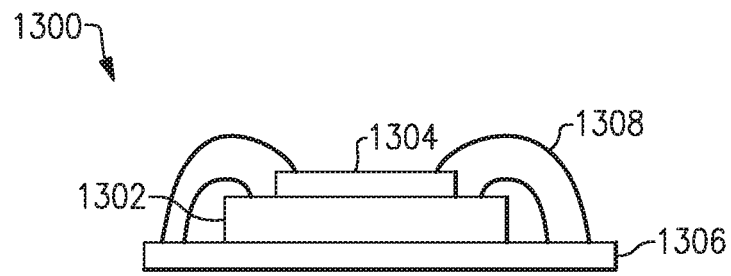
FIG. 13 illustrates an embodiment of a stacked assembly, according to certain embodiments.

FIG. 13 illustrates an exemplary stacked assembly 1300 comprising a first integrated circuit die 1302 mounted over and immediately adjacent to a laminate 1306. The stacked assembly 1300 further comprises a second integrated circuit die 1304 stacked over and immediately adjacent to the first integrated circuit die 1302. The first and second integrated circuit die 1302, 1304 are in electrical communication with pads and traces on the laminate 1306 via wire bonds 1308.

Figure 14:
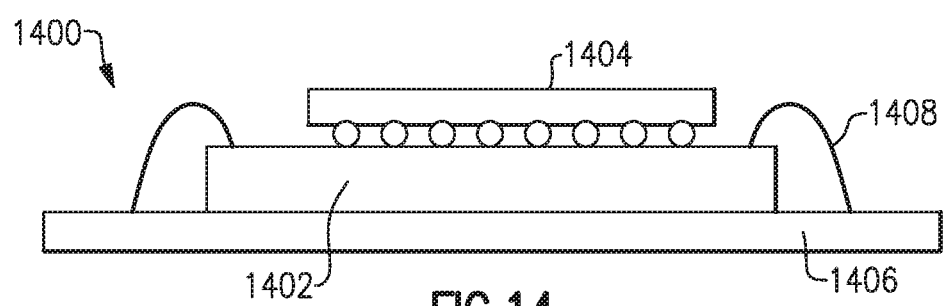
FIG. 14 illustrates another embodiment of a stacked assembly, according to certain embodiments.

FIG. 14 illustrates an exemplary stacked assembly 1400 comprising a first integrated circuit die 1402 in electrical communication with a laminate 1406 via one or more wire bonds 1408. The stacked assembly 1400 further comprises a second integrated circuit die 1404 over and immediately adjacent to the first integrated circuit die 1402. The first integrated circuit die 1402 is configured to electrically connect with the second integrated circuit die 1404. In an embodiment, the second integrated circuit die 1404 comprises a crystal. In another embodiment, the second integrated circuit die 1404 is configured as a surface mount device. In a further embodiment, the second integrated circuit die 1404 is configured as a flip chip.

In an embodiment, any of the stacking configurations 1210, 1220, 1230, 1240, 1250 and/or any of the stacked assemblies 1300, 1400 can be positioned in the cavity 1010 or the overhang 1006.

Figure 15:
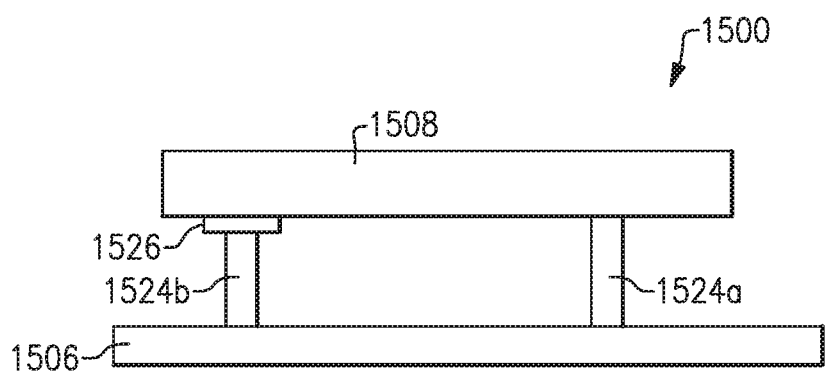
FIG. 15 illustrates an exemplary stacked assembly including supports and spacers, according to certain embodiments.

FIG. 15 illustrates an exemplary stacked assembly 1500 including supports 1524 and spacers 1526 that provide support for a top layer 1508 over a bottom layer 1506. A potential problem with the supports 1524 are the error tolerances. For example, one support 1524a could be higher than another support 1524b. Spacers 1526, for example, can be placed in between the support 1524b and the top layer 1508 or the bottom layer 1506 to offset any difference in height. In an embodiment, the spacers 1526 comprise a material that can be "squished" or compressed to fit in the gap that results from any difference in height between support 1524a and support 1524b.

Figure 16:
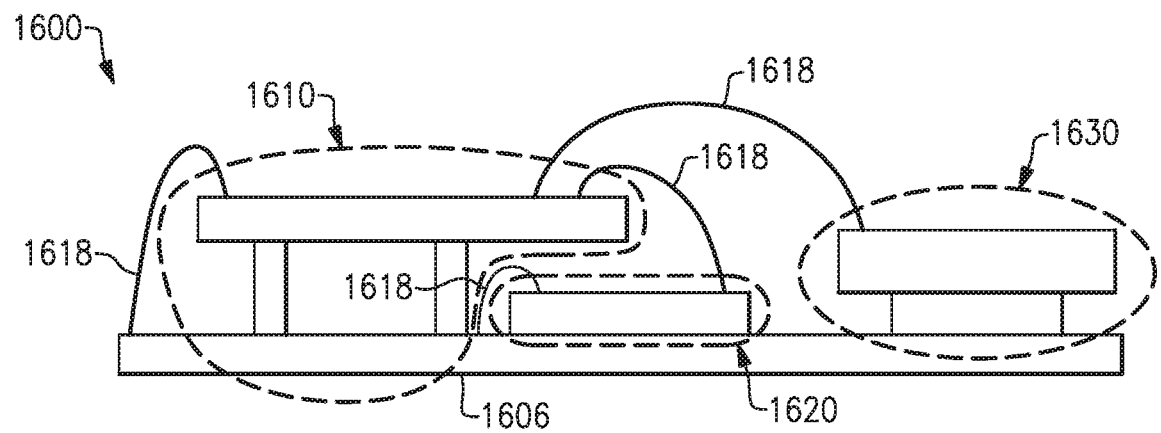
FIG. 16 illustrates an exemplary circuit assembly including a plurality of stacked assemblies, according to certain embodiments.

FIG. 16 illustrates an exemplary circuit assembly 1600 including a plurality of stacked assemblies 1610, 1620, 1630, a plurality of wire bonds 1618, and a bottom layer 1606. Stacked assembly 1600 illustrates one embodiment of multiple stacked assemblies 1610, 1620, 1630 can be assembled over and immediately adjacent to the bottom layer 1606. In an embodiment, stacked assembly 1620 fits at least partially in an overhang provided by stacked assembly 1610. Stacked assembly 1600 further illustrates wire bonds 1618 providing electrical communication between the stacker assembly 1610 and pads or traces on the bottom layer 1606 and between stacked assembly 16010 and stacked assembly 1630.

The circuit assemblies described herein can further comprise an overmold structure formed of a molding material. The molding material is pliable and moldable in process and becomes hard when cured. In an embodiment, the overmold structure covers at least a portion of the top of the substrate and one or more components located on the top portion of the substrate, where the bottom surface of the substrate is free from the overmold structure in order to make electrical connections to the circuit assembly. In other embodiments, the overmold structure covers at least a portion of the bottom surface of the substrate and one or more components located on the bottom of the substrate. Electrical connections to the circuit assemblies described herein are made from the top of the substrate.

Figure 17:
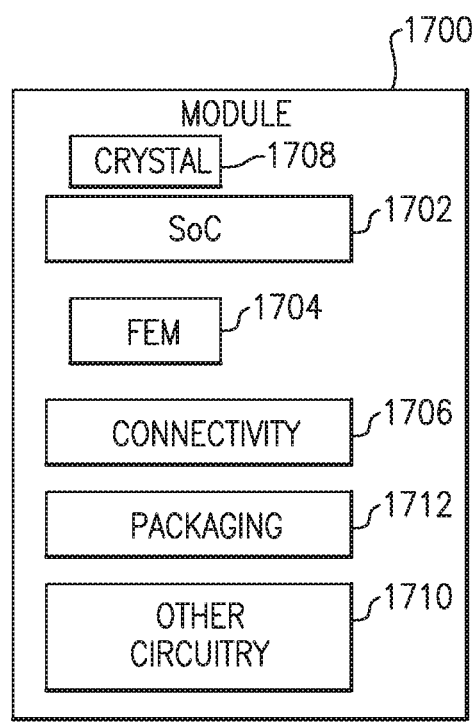
FIG. 17 is an exemplary block diagram of a system-in-a package for use in a wireless device, according to certain embodiments.

FIG. 17 is an exemplary block diagram of a solution in a package (SiP) 1700 including a crystal 1708, a SoC 1702, and an FEIC 1704. The SiP 1700 further includes connectivity 1706 to provide signal interconnections, packaging 1712, such as for example, a package substrate and/or an overmold, for packaging of the circuitry, and other circuitry 1710, such as, for example, load capacitors associated with the crystal 1708, pre-filters, post filters modulators, demodulators, down converters, and the like, as would be known to one of skill in the art of semiconductor fabrication in view of the disclosure herein. The SiP 1700 can comprise any of the SiPs 200, 300, 400, 500, 600, 700, 800, 900, 1000, 1300, 1400, 1500, 1600.

Figure 18:
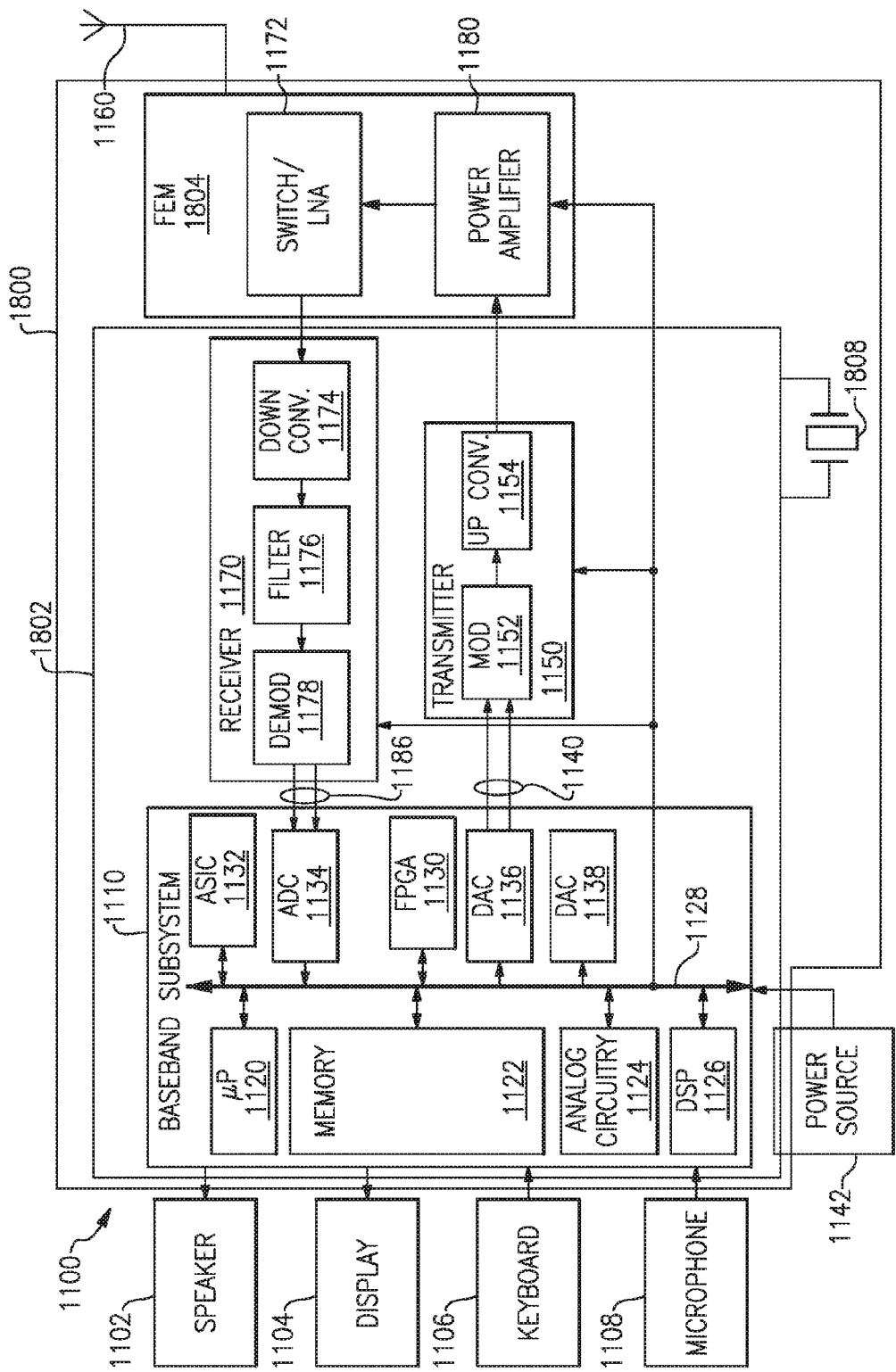
FIG. 18 is an exemplary block diagram illustrating a simplified wireless device including a system-in-a-package, according to certain embodiments.

FIG. 18 is an exemplary block diagram illustrating a simplified wireless device 1100 comprising a SiP 1800, where SiP 1800 comprises a SoC 1802, an FEIC 1804, and a crystal 1808. In an embodiment, the wireless device 1100 comprises a portable transceiver 1100. In an embodiment, SoC 1802 comprises a baseband subsystem 1110, receiver 1170, and transmitter 1150. The crystal 1808 supplies clock information for the SoC 1802. In an embodiment, SiP 1800 comprises any of SiP 200, 300, 400, 500, 600, 700, 800, 900, 1000, 1300, 1400, 1500, 1600, 1700.

The wireless device 1100 includes a speaker 1102, a display 1104, a keyboard 1106, and a microphone 1108, all connected to the baseband subsystem 1110. A power source 1142, which may be a direct current (DC) battery or other power source, is also connected to the baseband subsystem 1110 to provide power to the wireless device 1100. In a particular embodiment, wireless device 1100 can be, for example but not limited to, a portable telecommunication device such as a mobile cellular-type telephone. The speaker 1102 and the display 1104 receive signals from baseband subsystem 1110, as known to those skilled in the art. Similarly, the keyboard 1106 and the microphone 1108 supply signals to the baseband subsystem 1110.

The baseband subsystem 1110 includes a microprocessor (μP) 1120, memory 1122, analog circuitry 1124, and a digital signal processor (DSP) 1126 in communication via bus 1128. Bus 1128, although shown as a single bus, may be implemented using multiple busses connected as necessary among the subsystems within the baseband subsystem 1110. The baseband subsystem 1110 may also include one or more of an application specific integrated circuit (ASIC) 1132 and a field programmable gate array (FPGA) 1130.

The microprocessor 1120 and memory 1122 provide the signal timing, processing, and storage functions for wireless device 1100. The analog circuitry 1124 provides the analog processing functions for the signals within baseband subsystem 1110. The baseband subsystem 1110 provides control signals to a transmitter 1150, a receiver 1170, and a power amplifier circuit 1180.

It should be noted that, for simplicity, only the basic components of the wireless device 1100 are illustrated herein. The control signals provided by the baseband subsystem 1110 control the various components within the wireless device 1100. Further, the function of the transmitter 1150 and the receiver 1170 may be integrated into a transceiver.

The baseband subsystem 1110 also includes an analog-to-digital converter (ADC) 1134 and digital-to-analog converters (DACs) 1136 and 1138. In this example, the DAC 1136 generates in-phase (I) and quadrature-phase (Q) signals 1140 that are applied to a modulator 1152. The ADC 1134, the DAC 1136, and the DAC 1138 also communicate with the microprocessor 1120, the memory 1122, the analog circuitry 1124, and the DSP 1126 via bus 1128. The DAC 1136 converts the digital communication information within baseband subsystem 1110 into an analog signal for transmission to the modulator 1152 via connection 1140. Connection 1140, while shown as two directed arrows, includes the information that is to be transmitted by the transmitter 1150 after conversion from the digital domain to the analog domain.

The transmitter 1150 includes the modulator 1152, which modulates the analog information on connection 1140 and provides a modulated signal to upconverter 1154. The upconverter 1154 transforms the modulated signal to an appropriate transmit frequency and provides the upconverted signal to the power amplifier circuit 1180. The power amplifier circuit 1180 amplifies the signal to an appropriate power level for the system in which the wireless device 1100 is designed to operate.

Details of the modulator 1152 and the upconverter 1154 have been omitted, as they will be understood by those skilled in the art. For example, the data on connection 1140 is generally formatted by the baseband subsystem 1110 into in-phase (I) and quadrature (Q) components. The I and Q components may take different forms and be formatted differently depending upon the communication standard being employed.

The front-end module 1804 comprises the power amplifier (PA) circuit 1180 and a switch/low noise amplifier (LNA) circuit 1172 comprising a low noise amplifier. In an embodiment, the switch/low noise amplifier circuit 1172 further comprises an antenna system interface that may include, for example, a diplexer having a filter pair that allows simultaneous passage of both transmit signals and receive signals, as known to those having ordinary skill in the art.

The power amplifier circuit 1180 supplies the amplified transmit signal to the switch/low noise amplifier circuit 1172. The transmit signal is supplied from the front-end module 1804 to the antenna 1160 when the switch is in the transmit mode.

A signal received by antenna 1160 will be directed from the switch/low noise amplifier circuit 1172 of the front-end module 1804 to the receiver 1170 when the switch is in the receive mode. The low noise amplifier circuit 1172 amplifies the received signal.

If implemented using a direct conversion receiver (DCR), the downconverter 1174 converts the amplified received signal from an RF level to a baseband level (DC), or a near-baseband level (approximately 100 kHz). Alternatively, the amplified received RF signal may be downconverted to an intermediate frequency (IF) signal, depending on the application. The downconverted signal is sent to the filter 1176. The filter 1176 comprises at least one filter stage to filter the received downconverted signal as known in the art.

The filtered signal is sent from the filter 1176 to the demodulator 1178. The demodulator 1178 recovers the transmitted analog information and supplies a signal representing this information via connection 1186 to the ADC 1134. The ADC 1134 converts these analog signals to a digital signal at baseband frequency and transfers the signal via bus 1128 to the DSP 1126 for further processing.

Many other variations of stacked components than those described herein will be apparent from this disclosure. Different combinations of the components illustrated in SiPs 200, 300, 400, 500, 600, 700, 800, 900, 1000, 1300, 1400, 1500, 1600, 1700 are possible to form a variety of SiPs that can be used in wireless devices to provide smaller footprints, reduced parasitic capacitance, and a decreased signal cross-coupling.

Terminology

The headings provided herein, if any, are for convenience only and do not necessarily affect the scope or meaning of the claimed inventions.

Many other variations than those described herein will be apparent from this disclosure. For example, depending on the embodiment, certain acts, events, or functions of any of the algorithms described herein can be performed in a different sequence, can be added, merged, or left out altogether (e.g., not all described acts or events are necessary for the practice of the algorithms).

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Conditional language used herein, such as, among others, "can," "might," "may," "e.g.," and the like, unless specifically stated otherwise, or otherwise understood within the context as used, is generally intended to convey that certain embodiments include, while other embodiments do not include, certain features, elements, and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. Further, the term "each," as used herein, in addition to having its ordinary meaning, can mean any subset of a set of elements to which the term "each" is applied.

The above detailed description of embodiments of the inventions is not intended to be exhaustive or to limit the inventions to the precise form disclosed above. While specific embodiments of, and examples for, the inventions are described above for illustrative purposes, various equivalent modifications are possible within the scope of the inventions, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the inventions provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions, and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A packaged module for use in a wireless communication device, the packaged module comprising:
   a substrate;
   a first die supported by the substrate and including at least a microprocessor and one or more of radio frequency transmitter circuitry and radio frequency receiver circuitry;
   a crystal supported by the substrate, the first die disposed between the crystal and the substrate;
   an interposer disposed between the crystal and the first die; and
   an overmold which encloses the first die, the interposer, and the crystal.

2. The packaged module of claim 1 further comprising a second die supported by the substrate and including at least a power amplifier for amplifying a radio frequency input signal, the second die disposed on an opposite side of the substrate from the first die and the crystal.

3. The packaged module of claim 1 wherein the crystal is packaged in a housing having one or more pillars along one or more sides of the housing, the one or more pillars formed from a top surface of the housing to a bottom surface of the housing and including a conductive material.

4. The packaged module of claim 1 wherein the crystal is physically mounted to the interposer and is in electrical communication with the interposer, the interposer configured to route signals between the crystal and the substrate via wire bonds from the interposer to the substrate.

5. The packaged module of claim 2 further comprising one or more load capacitors associated with the crystal, the one or more load capacitors physically mounted to the interposer and in electrical communication with the interposer, the interposer configured to route signals between the one or more load capacitors and the crystal.

6. The packaged module of claim 1 wherein the first die is wire bonded to the substrate.

7. The packaged module of claim 1 wherein the first die is housed in a flip chip package and in electrical communication with the substrate via solder bumps associated with the flip chip package.

8. The packaged module of claim 1 wherein the crystal is packaged in a flip chip package and in electrical communication with the first die via solder bumps associated with the flip chip package.

9. A packaged module for use in a wireless communication device, the packaged module comprising:
   a substrate;

a first die supported by the substrate and including at least a microprocessor and one or more of radio frequency transmitter circuitry and radio frequency receiver circuitry;

a crystal supported by the substrate, the first die disposed between the crystal and the substrate, the crystal attached to the first die and packaged in a surface mount package that is mounted upside down on the first die; and an overmold which encloses the first die and the crystal.

10. The packaged module of claim 9 wherein a first surface mount pad of the surface mount package is in electrical communication with a crystal oscillator circuit via a first wirebond and a second surface mount pad of the surface mount package is in electrical communication with a ground via a second wirebond.

11. The packaged module of claim 9 wherein at least one load capacitor associated with the crystal is mounted across first and second wirebond pads of the surface mount package and in electrical communication with the substrate via at least one wirebond.

12. The packaged module of claim 9 wherein a first end of a load capacitor associated with the crystal is in electrical communication with a first wirebond pad of the surface mount package and a second end of the load capacitor is wirebonded to a second surface mount pad of the surface mount package.

13. A packaged module for use in a wireless communication device, the packaged module comprising:

a substrate;

a first die supported by the substrate and including at least a microprocessor and one or more of radio frequency transmitter circuitry and radio frequency receiver circuitry;

a crystal supported by the substrate, the first die disposed between the crystal and the substrate, an equivalent series resistance of the crystal being approximately 150 ohms; and an overmold which encloses the first die and the crystal.

14. A stacked circuit assembly for use in a packaged module, the stacked circuit assembly comprising:

a substrate;

a first die supported by the substrate and including at least a microprocessor and one or more of radio frequency transmitter circuitry and radio frequency receiver circuitry; and a crystal supported by the substrate, the first die disposed between the crystal and the substrate, an equivalent series resistance of the crystal being between approximately 100 ohms and approximately 150 ohms.

15. A wireless device comprising:

an antenna implemented to receive a radio frequency input signal and to transmit a radio frequency output signal;

a packaged module including a substrate, a first die supported by the substrate and including at least a microprocessor and one or more of radio frequency transmitter circuitry and radio frequency receiver circuitry, a crystal supported by the substrate, and an overmold which encloses the first die and the crystal, the first die disposed between the crystal and the substrate; and a front-end integrated circuit supported by the substrate over one side of the substrate, the first die and the crystal supported over an opposite side of the substrate, the packaged module implemented to provide the antenna with the radio frequency output signal and to receive from the antenna the radio frequency input signal.

16. The wireless device of claim 15 wherein an equivalent series resistance of the crystal is approximately 100 ohms.

17. The packaged module of claim 13 further comprising a second die supported by the substrate and including at least a power amplifier for amplifying a radio frequency input signal, the second die disposed on an opposite side of the substrate from the first die and the crystal.

18. The packaged module of claim 13 wherein the crystal is packaged in a housing having one or more pillars along one or more sides of the housing, the one or more pillars formed from a top surface of the housing to a bottom surface of the housing and including a conductive material.

19. The stacked circuit assembly of claim 14 wherein the first die is wire bonded to the substrate.

20. The stacked circuit assembly of claim 14 wherein the first die is housed in a flip chip package and in electrical communication with the substrate via solder bumps associated with the flip chip package.

* * * * *

UNITED STATES PATENT AND TRADEMARK OFFICE
CERTIFICATE OF CORRECTION

PATENT NO.         : 10,062,670 B2                       Page 1 of 1
APPLICATION NO.    : 15/489528
DATED              : August 28, 2018
INVENTOR(S)        : Darren Roger Frenette It is certified that error appears in the above-identified patent and that said Letters Patent is hereby corrected as shown below:

In the Specification

In Column 8, Line 47 (Approx.), change "FIG." to --FIGS.--

In Column 8, Line 50, change "FIG." to --FIGS.--

In the Claims

In Column 24, Line 49, Claim 5, change "claim 2" to --claim 1--

Signed and Sealed this
First Day of January, 2019

Andrei Iancu
*Director of the United States Patent and Trademark Office*